(12) United States Patent
Gu et al.

(10) Patent No.: US 11,476,448 B2
(45) Date of Patent: Oct. 18, 2022

(54) DISPLAY DEVICE AND PREPARATION METHOD THEREOF

(71) Applicant: Shanghai Tianma Micro-Electronics Co., Ltd., Shanghai (CN)

(72) Inventors: Yuefeng Gu, Shanghai (CN); Jiandong Wang, Shanghai (CN); Zhiyuan Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 262 days.

(21) Appl. No.: 17/007,776

(22) Filed: Aug. 31, 2020

(65) Prior Publication Data

US 2021/0408495 A1 Dec. 30, 2021

(30) Foreign Application Priority Data

Jun. 30, 2020 (CN) .......................... 202010622455.2

(51) Int. Cl.
*H01L 51/52* (2006.01)
*G02F 1/1335* (2006.01)
*G06F 3/044* (2006.01)
*G02F 1/1333* (2006.01)
*H01L 27/32* (2006.01)

(52) U.S. Cl.
CPC .... *H01L 51/5281* (2013.01); *G02F 1/133502* (2013.01); *G02F 1/13338* (2013.01); *G02F 1/133514* (2013.01); *G02F 1/133528* (2013.01); *G06F 3/0443* (2019.05); *G06F 3/0446* (2019.05); *H01L 27/322* (2013.01); *H01L 27/323* (2013.01)

(58) Field of Classification Search
CPC . H01L 51/5281; H01L 27/322; H01L 27/323; G02F 1/133502; G02F 1/13338; G02F 1/133514; G02F 1/133528
USPC .......................................................... 349/137
See application file for complete search history.

(56) References Cited

U.S. PATENT DOCUMENTS

2009/0297877 A1* 12/2009 Chang .................... G02B 1/115
427/165

FOREIGN PATENT DOCUMENTS

CN 110563342 A 12/2019

\* cited by examiner

*Primary Examiner* — Charles S Chang
(74) *Attorney, Agent, or Firm* — von Briesen & Roper, s.c.

(57) ABSTRACT

Provided are a display device and a preparation method thereof. The display device includes a display panel and a first antireflection structure and a second antireflection structure successively stacked on a side of a display functional layer facing away from a driving substrate, where the display panel includes the driving substrate and the display functional layer. The first antireflection structure includes a first graded-index layer, a conductive layer and a second graded-index layer which are successively stacked; the first graded-index layer includes at least two first sublayers, and the second graded-index layer includes at least two second sublayers. The second antireflection structure includes a third graded-index layer, a first dielectric layer and a fourth graded-index graded layer which are successively stacked; the third graded-index layer includes at least one third sublayer, and the fourth graded-index layer includes at least two fourth sublayers.

20 Claims, 18 Drawing Sheets

DISPLAY DEVICE AND PREPARATION METHOD THEREOF

CROSS-REFERENCE TO RELATED APPLICATION

This application claims priority to Chinese Patent Application No. 202010622455.2 filed Jun. 30, 2020, the disclosure of which is incorporated herein by reference in its entirety.

TECHNICAL FIELD

The present disclosure relates to a display technology and, in particular, to a display device and a preparation method thereof.

BACKGROUND

As the display technology develops rapidly, electronic products such as mobile phones and tablet computers are more and more widely applied, and people have higher and higher requirements for display quality.

For example, for an existing display panel, an antireflection structure reducing reflectivity of light is disposed on the side of light emitting surface of the display panel to improve the display quality, and a low-reflectivity anti-shadow layer is disposed to reduce the visibility of etching marks in the transparent conductive layer in a touch structure. The existing antireflection structure and the anti-shadow layer usually include a cycle structure in which a plurality of layers of high refractive index materials and low refractive index materials are alternately stacked, and the purposes of reducing reflected light and anti-shadow are achieved by utilizing the principle of destructive interference. Since the principle of destructive interference is utilized in the related art, the thicknesses of the material and the film layer are fixed, and the requirements of hue and low reflection are difficult to be satisfied simultaneously during application; in the process of preparing the high refractive index material and the low refractive index material which are alternately stacked, chambers for different materials and even different film forming machines are required to be switched back and forth, so that the preparation cost is high.

SUMMARY

The present disclosure provides a display device and a preparation method thereof. The display device includes a first antireflection structure and a second antireflection structure. Graded-index layers are disposed in the two antireflection structures to weaken the dielectric interface, achieving the effect of antireflection. Hue adjustment is also achieved according to the relationships between refractive indexes and between thicknesses of various sublayers. Thus, the requirements of hue and low reflectivity are simultaneously satisfied. Moreover, each graded-index layer is a whole layer of material and can be formed by one process, thus being beneficial to reducing process difficulty and preparation cost.

In a first aspect, the present disclosure provides a display device. The display device includes a display panel, where the display panel includes a driving substrate and a display functional layer located on a side of the driving substrate. The display device also includes a first antireflection structure and a second antireflection structure successively stacked on a side of a display functional layer facing away from a driving substrate.

The first antireflection structure includes a first graded-index layer, a conductive layer and a second graded-index layer which are successively stacked; the first graded-index layer includes at least two first sublayers, and the second graded-index layer includes at least two second sublayers; in a direction in which the first graded-index layer points to the conductive layer, refractive indexes of the at least two first sublayers in the first graded-index layer successively increase, and refractive indexes of the at least two second sublayers in the second graded-index layer successively decrease; a refractive index of a first sublayer adjacent to the conductive layer is less than or equal to a refractive index of the conductive layer; and a refractive index of a second sublayer adjacent to the conductive layer is less than or equal to the refractive index of the conductive layer.

The second antireflection structure includes a third graded-index layer, a first dielectric layer and a fourth graded-index graded layer which are successively stacked; the third graded-index layer includes at least one third sublayer, and the fourth graded-index layer includes at least two fourth sublayers; in a direction in which the third graded-index layer points to the first dielectric layer, refractive indexes of the at least two fourth sublayers in the fourth graded-index layer successively decrease; a refractive index of a third sublayer adjacent to the first dielectric layer is less than or equal to a refractive index of the first dielectric layer, and a refractive index of a third sublayer close to the display functional layer is greater than or equal to a refractive index of a second sublayer far from the display functional layer; and a refractive index of a fourth sublayer adjacent to the first dielectric layer is less than or equal to the refractive index of the first dielectric layer.

In a second aspect, the present disclosure further provides a preparation method of a display device. The method includes steps described below.

A display panel is provided, where the display panel includes a driving substrate and a display functional layer located on a side of the driving substrate.

A first antireflection structure and a second antireflection structure successively stacked are formed on a side of the display functional layer facing away from the driving substrate.

The first antireflection structure includes a first graded-index layer, a conductive layer and a second graded-index layer which are successively stacked; the first graded-index layer includes at least two first sublayers, and the second graded-index layer includes at least two second sublayers; in a direction in which the first graded-index layer points to the conductive layer, refractive indexes of the at least two first sublayers in the first graded-index layer successively increase, and refractive indexes of the at least two second sublayers in the second graded-index layer successively decrease; a refractive index of a first sublayer adjacent to the conductive layer is less than or equal to a refractive index of the conductive layer; and a refractive index of a second sublayer adjacent to the conductive layer is less than or equal to the refractive index of the conductive layer. The second antireflection structure includes a third graded-index layer, a first dielectric layer and a fourth graded-index graded layer which are successively stacked; the third graded-index layer includes at least one third sublayer, and the fourth graded-index layer includes at least two fourth sublayers; in a direction in which the third graded-index layer points to the first dielectric layer, refractive indexes of the at least two fourth sublayers in the fourth graded-index layer successively decrease; a refractive index of a third sublayer adjacent to the first dielectric layer is less than or equal to a refractive index of the first dielectric layer, and a refractive index of a third sublayer closest to the first antireflection structure is greater than or equal to a refractive index of a film layer adjacent to the third sublayer and close to the first antireflection structure; and a refractive index of a fourth sublayer adjacent to the first dielectric layer is less than or equal to the refractive index of the first dielectric layer.

The display device provided in the embodiment of the present disclosure includes the display panel, where the display panel includes the driving substrate and the display functional layer located on a side of the driving substrate. The display panel also includes the first antireflection structure and the second antireflection structure successively stacked on the side of the display functional layer facing away from the driving substrate. The first antireflection structure includes the first graded-index layer, the conductive layer and the second graded-index layer which are successively stacked; the first graded-index layer includes at least two first sublayers, and the second graded-index layer includes at least two second sublayers; in the direction in which the first graded-index layer points to the conductive layer, the refractive indexes of the at least two first sublayers in the first graded-index layer successively increase, and the refractive indexes of the at least two second sublayers in the second graded-index layer successively decrease; the refractive index of the first sublayer adjacent to the conductive layer is less than or equal to the refractive index of the conductive layer; and the refractive index of the second sublayer adjacent to the conductive layer is less than or equal to the refractive index of the conductive layer. The second antireflection structure includes the third graded-index layer, the first dielectric layer and the fourth graded-index graded layer which are successively stacked; the third graded-index layer includes at least one third sublayer, and the fourth graded-index layer includes at least two fourth sublayers; in the direction in which the third graded-index layer points to the first dielectric layer, the refractive indexes of the at least two fourth sublayers in the fourth graded-index layer successively decrease; the refractive index of the third sublayer adjacent to the first dielectric layer is less than or equal to the refractive index of the first dielectric layer, and the refractive index of the third sublayer close to the display functional layer is greater than or equal to the refractive index of the second sublayer far from the display functional layer; and the refractive index of the fourth sublayer adjacent to the first dielectric layer is less than or equal to the refractive index of the first dielectric layer. The refractive index of the conductive layer is set to be greater than the refractive indexes of the first graded-index layer and the second graded-index layer, and the refractive index of the first dielectric layer is set to be greater than the refractive indexes of the third graded-index layer and the fourth graded-index layer, thus forming a film structure having changing refractive indexes. The first graded-index layer, the second graded-index layer and the fourth graded-index layer are each set to include at least two sublayers to weaken the dielectric interface, and achieve the purpose of reducing reflected light and improving transmitted light by combining the principles of film interference and refractive index gradient. In the preparation process, each graded-index layer is a whole layer of material and can be formed by one process, thus being beneficial to reducing process difficulty and preparation cost. Hue adjustment is achieved according to combined adjustment of the relationships between refractive indexes and between thicknesses of various sublayers. Thus, the requirements of hue and low reflectivity are simultaneously satisfied by the antireflection structures.

DETAILED DESCRIPTION

Figure 1:
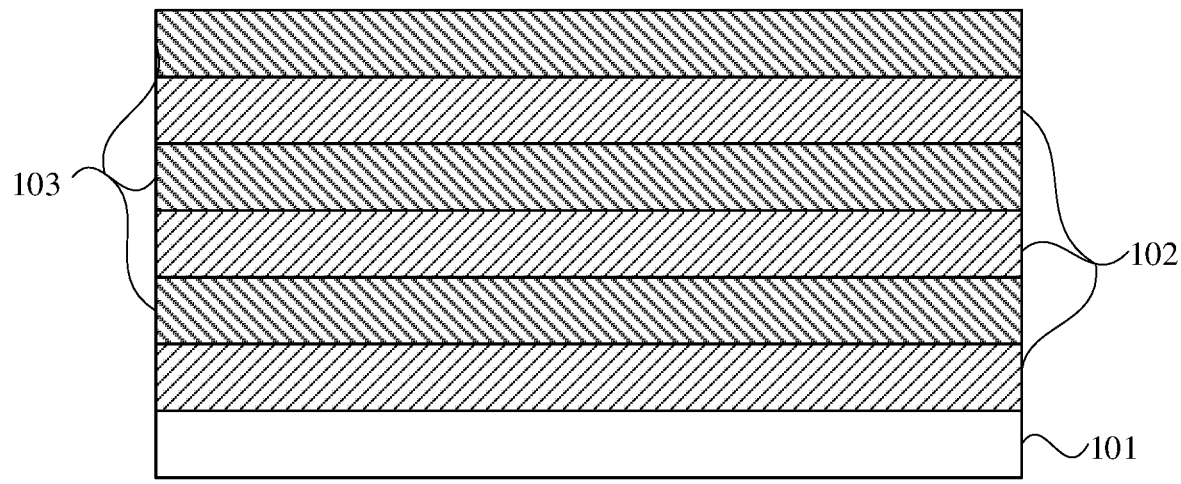
FIG. 1 is a structure diagram of a low-reflectivity cover plate in the related art.

Hereinafter the present disclosure will be further described in detail in conjunction with the drawings and embodiments. It is to be understood that the specific embodiments set forth herein are merely intended to illustrate and not to limit the present disclosure. Additionally, it is to be noted that for ease of description, merely part, not all, of the structures related to the present disclosure are illustrated in the drawings.

Terms used in the embodiments of the present disclosure are merely used to describe specific embodiments and not intended to limit the present disclosure. It is to be noted that nouns of locality, including "on", "below", "left" and "right", used in the embodiments of the present disclosure are described from the angles illustrated in the drawings, and are not to be construed as a limitation to the embodiments of the present disclosure. Additionally, in the context, it is to be understood that when an element is formed "on" or "below" another element, the element may not only be directly formed "on" or "below" another element, and may be indirectly formed "on" or "below" another element via an intermediate element. The terms "first", "second" and the like are merely used for description and used to distinguish between different components rather than indicate any order, quantity, or importance. For those of ordinary skill in the art, the above terms can be construed according to specific situations in the present disclosure.

In the related art, a low-reflectivity cover plate is disposed on the light emitting side of the display panel, so that the display quality of the display panel is improved and the influence of external environment light on a display picture is reduced. Exemplarily, FIG. 1 is a structure diagram of a low-reflectivity cover plate in the related art. Referring to FIG. 1, an existing low-reflectivity cover plate includes a glass substrate 101, and high refractive index layers 102 and low refractive index layers 103 alternately stacked on a side of the glass substrate 101. For the display panel integrated with a touch function, due to the etching shape of the transparent conductive layer forming the touch electrode, the reflectivities in different regions are different, and apparent etching marks will appear when external light is strong. In order to reduce the visibility of etching marks in the transparent conductive layer, a touch layer is generally provided with an anti-shadow layer with a high and low refractive index stacking structure similar to the structure in FIG. 1. However, such structure in which the high refractive index layers and the low refractive index layers are alternately stacked requires chambers for different materials and even different film forming machines to be switched back and forth during preparation, and is complicated in process and high in cost. Moreover, in the related art, the low-reflectivity cover plate and the anti-shadow layer are generally directly superimposed, so that on the one hand, the problem of high reflectivity exists, and on the other hand, due to of stacking of high/low/high/low refractive index film layers, the refractive index between the film layers is fixed, the hue cannot be adjusted, and the requirement for high quality display may not be met.

In view of the above matter, an embodiment of the present disclosure provides a display device provided with two layers of antireflection structures which are considered as a whole during design, where one layer of antireflection structure may be a touch structure and the other layer of antireflection structure is a cover plate structure, so that the requirements for low reflectivity, hue and the like can be satisfied. The display device provided in the embodiment of the present disclosure includes a display panel, where the display panel includes a driving substrate and a display functional layer located on a side of the driving substrate. The display device also includes a first antireflection structure and a second antireflection structure successively stacked on a side of the display functional layer facing away from the driving substrate. The first antireflection structure includes a first graded-index layer, a conductive layer and a second graded-index layer which are successively stacked. The first graded-index layer includes at least two first sublayers, and the second graded-index layer includes at least two second sublayers. In the direction in which the first graded-index layer points to the conductive layer, refractive indexes of the at least two first sublayers in the first graded-index layer successively increase, and refractive indexes of the at least two second sublayers in the second graded-index layer successively decrease. The refractive index of the first sublayer adjacent to the conductive layer is less than or equal to the refractive index of the conductive layer; and the refractive index of the second sublayer adjacent to the conductive layer is less than or equal to the refractive index of the conductive layer. The second antireflection structure includes a third graded-index layer, a first dielectric layer and a fourth graded-index graded layer which are successively stacked. The third graded-index layer includes at least one third sublayer, and the fourth graded-index layer includes at least two fourth sublayers. In the direction in which the third graded-index layer points to the first dielectric layer, refractive indexes of the at least two fourth sublayers in the fourth graded-index layer successively decrease. The refractive index of the third sublayer adjacent to the first dielectric layer is less than or equal to the refractive index of the first dielectric layer, and the refractive index of the third sublayer close to the display functional layer is greater than or equal to the refractive index of the second sublayer far from the display functional layer. The refractive index of the fourth sublayer adjacent to the first dielectric layer is less than or equal to the refractive index of the first dielectric layer.

Figure 2:
FIG. 2 is a structure diagram of a display device according to an embodiment of the present disclosure.

Exemplarily, FIG. 2 is a structure diagram of a display device according to an embodiment of the present disclosure. Referring to FIG. 2, a display device 10 provided in the embodiment includes a display panel 10, a first antireflection structure 20 and a second antireflection structure 30. The display panel 10 includes a driving substrate 11 and a display functional layer 12 located on a side of the driving substrate 11. The first antireflection structure 20 includes a first graded-index layer 21, a conductive layer 22 and a second graded-index layer 23 which are successively stacked. The first graded-index layer 21 includes two first sublayers, i.e., a first sublayer 211 and a first sublayer 212, and the second graded-index layer 23 includes two second sublayers, i.e., a second sublayer 231 and a second sublayer 232. In the direction z in which the first graded-index layer points to the conductive layer 22, refractive indexes of the first sublayer 211 and the first sublayer 212 successively increase, and refractive indexes of the second sublayer 231 and the second sublayer 232 successively decrease. The refractive index of the first sublayer 212 adjacent to the conductive layer 22 is less than the refractive index of the conductive layer 22; and the refractive index of the second sublayer 231 adjacent to the conductive layer 22 is less than the refractive index of the conductive layer 22. The second antireflection structure 30 includes a third graded-index layer 31, a first dielectric layer 32 and a fourth graded-index graded layer 33 which are successively stacked. The third graded-index layer 31 includes one third sublayer 311, and the refractive index of the third sublayer 311 is greater than the refractive index of the second sublayer 232, forming a structure having a graded refractive index in the z direction. The fourth graded-index layer 33 includes two fourth sublayers, i.e., a fourth sublayer 331 and a fourth sublayer 332. In the direction z in which the third graded-index layer 31 points to the first dielectric layer 32, refractive indexes of the fourth sublayer 331 and the fourth sublayer 332 successively decrease. The refractive index of the third sublayer 311 is less than the refractive index of the first dielectric layer 32. The refractive index of the fourth sublayer 331 is less than the refractive index of the first dielectric layer 32.

The driving substrate 11 includes a driving circuit, for example, includes a plurality of thin film transistors arranged in an array, scanning lines, data lines, power lines, cathode lines, anode lines, and the like. The type of the display functional layer 12 is not limited in the embodiment of the present disclosure. For example, the display panel 10 may be a liquid crystal display panel, in which case the display functional layer 12 includes liquid crystal; the display panel 10 may be an organic light emitting display panel, in which case the display functional layer 12 includes an organic light emitting diode (OLED); the display panel 10 may be a light emitting diode (LED) display panel, and the display functional layer 12 includes an LED chip; the display panel 10 may be a quantum dot light emitting display panel, and the display functional layer 12 includes a quantum dot layer; the display panel 10 may also be an electrophoretic display panel, and the display functional layer 12 includes an electrophoretic film or the like. The type of the display functional layer 12 may be selected according to actual conditions in specific implementation. The first antireflection structure 20 may be a touch structure and may also be an antistatic structure. The second antireflection structure 30 may be a cover plate structure of a display panel. The graded-index layer may be formed of materials such as silicon oxynitride, and the refractive index gradient is achieved through adjustment of the mass proportions of nitrogen and oxygen.

Figure 3:
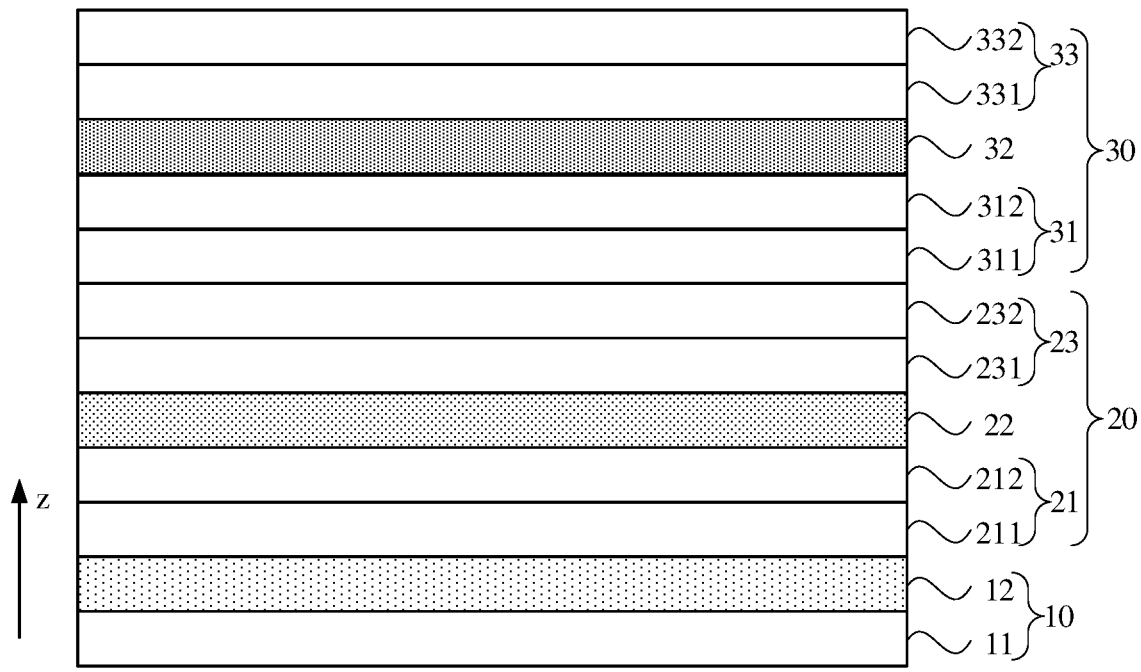
FIG. 3 is a structure diagram of another display device according to an embodiment of the present disclosure.

It is to be understood that FIG. 2 schematically shows that the first graded-index layer 21, the second graded-index layer 23 and the fourth graded-index layer 33 each include two sublayers and that the third graded-index layer 31 includes one sublayer. In other embodiments, the number of sublayers of each graded-index layer may also be different, and may be flexibly designed according to actual requirements in specific implementation. Exemplarily, FIG. 3 is a structure diagram of another display device according to an embodiment of the present disclosure. In the embodiment, the third graded-index layer 31 includes two third sublayers, i.e., a third sublayer 311 and a third sublayer 312. In other embodiments, when the number of sublayers in a graded-index layer is relatively large, for example, when the number of sublayers of the first graded-index layers 21 and the number of sublayers of the second graded-index layer 23 are greater than or equal to three, the refractive indexes of the first sublayer and the second sublayer which are adjacent to the conductive layer 22 may be equal to the refractive index of the conductive layer 22; for example, when the number of sublayers of the third graded-index layer 31 is greater than or equal to two and the number of sublayers of the fourth graded-index layer 33 is greater than or equal to three, the refractive indexes of the third sublayer and the fourth sublayer which are adjacent to the first dielectric layer 32 may be equal to the refractive index of the first dielectric layer 32. In the embodiment shown in FIG. 2, the third graded-index layer 31 schematically shows merely one third sublayer 311, and no graded-index structure is formed in the third graded-index layer 31 itself. The refractive index of the third sublayer 311 is greater than the refractive index of the second sublayer 232, therefore, as a whole, the film layers below the first dielectric layer 32 also form a structure with an increasing refractive index in the z direction, and such structure is equivalent to the graded-index structure. It is to be additionally noted that in the specific implementation, each graded-index layer is a whole-layer structure, that the layered structures are merely shown when the refractive index change is indicated, and that no apparent layered structure exists in the actual structure. At each graded-index layer, the flow of the gas can be gradually increased or decreased during the film formation process according to the order of the refractive index gradient, so that the process difficulty is reduced and the feasibility is improved. Moreover, the two antireflection structures are considered as a whole structure. The relationships between the refractive indexes and between thicknesses of various film layers can be adjusted to simultaneously reduce reflection and improve and adjust the reflection hue.

In specific implementation, the conductive layer 22 may include any one of indium tin oxide (ITO), fluorine-doped tin oxide (FTO), antimony tin oxide (ATO), aluminum-doped zinc oxide (AZO), boron-doped zinc oxide (BZO), gallium-doped zinc oxide (GZO), or 3, 4-ethylenedioxythiophene polymer (PEDOT), and selection may be flexibly made according to actual conditions. In other embodiments, the conductive layer 22 may also be a thin film formed of metal and oxides thereof, metal nanowires, graphene, etc., as long as the characteristics of transparency for the light emitted by the display device and conductivity are satisfied. The first dielectric layer 32 may include niobium pentoxide ($Nb_2O_5$), titanium dioxide ($TiO_2$) or silicon nitride ($SiN_x$), and selection can be flexibly made according to actual conditions in specific implementation.

According to the technical solution in the embodiment of the present disclosure, the refractive index of the conductive layer is set to be greater than the refractive indexes of the first graded-index layer and the second graded-index layer, and the refractive index of the first dielectric layer is set to be greater than the refractive indexes of the third graded-index layer and the fourth graded-index layer, thus forming a film structure having a changing refractive index. The first graded-index layer, the second graded-index layer and the fourth graded-index layer are each set to include at least two sublayers to weaken the dielectric interface, and achieve the purpose of reducing reflected light and improving transmitted light by combining the principles of film interference and refractive index gradient. In the preparation process, each graded-index layer is a whole layer of material and can be formed by one process, thus being beneficial to reducing process difficulty and preparation cost. Hue adjustment is achieved according to combined adjustment of the relationships between refractive indexes and between thicknesses of various sublayers. Thus, the requirements of hue and low reflectivity are simultaneously satisfied by the antireflection structures.

On the basis of the above embodiment, optionally, the display device provided by the embodiment of the present disclosure further includes a first substrate, where the first substrate is a second sublayer far from the display functional layer.

Figure 4:
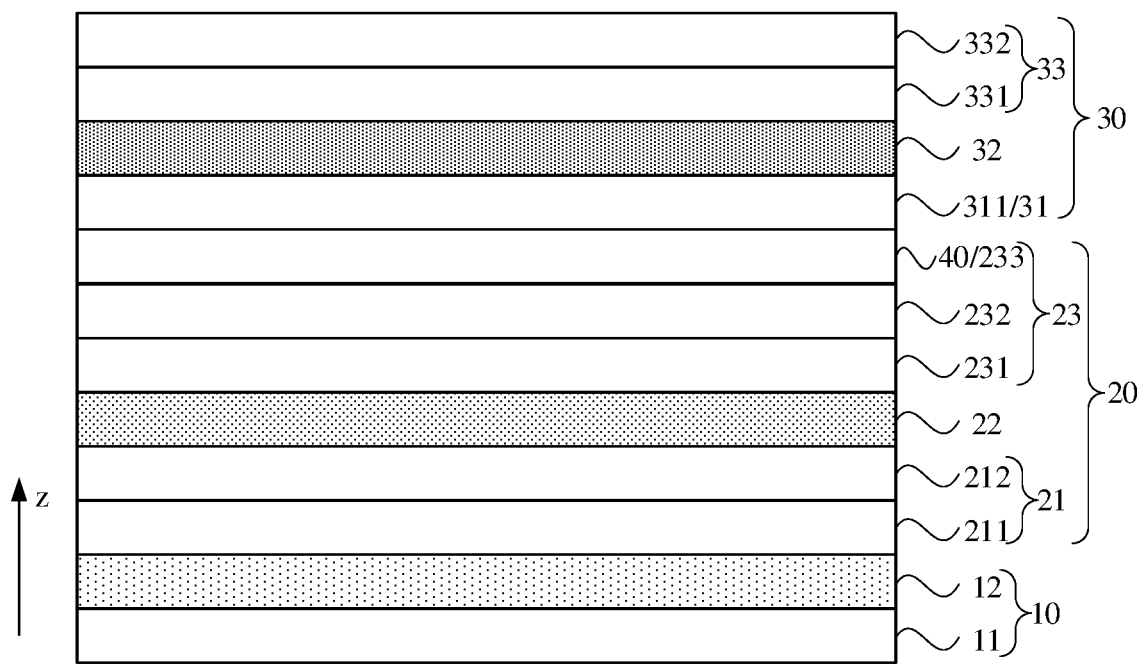
FIG. 4 is a structure diagram of another display device according to an embodiment of the present disclosure.

Exemplarily, FIG. 4 is a structure diagram of another display device according to an embodiment of the present disclosure. Referring to FIG. 4, the display device further includes a first substrate 40, where the refractive index of the first substrate 40 is less than the refractive indexes of the adjacent second sublayer 232 and the adjacent third sublayer 311. In specific implementation, the first substrate 40 may be a glass substrate. In the embodiment, the first substrate 40 is used as the sublayer 233 of the second graded-index layer 23 farthest from the display functional layer 12 and may be simultaneously used as a sublayer of the third graded-index layer 31 to form a film layer structure in which the refractive index first decreases and then increases in the z direction.

Figure 5:
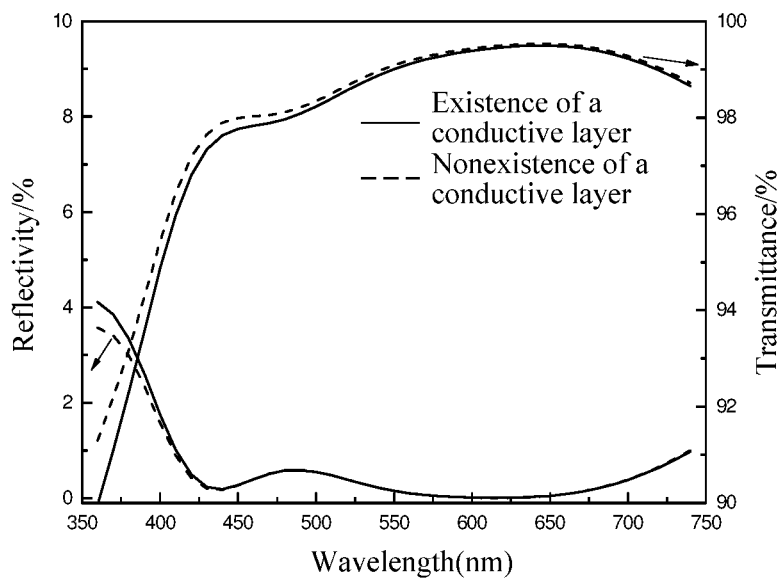
FIG. 5 is a schematic diagram illustrating simulation results of transmittance and reflectivity of a first antireflection structure and a second antireflection structure which are stacked according to an embodiment of the present disclosure.

FIG. 5 is a schematic diagram illustrating simulation results of transmittance and reflectivity of a first antireflection structure and a second antireflection structure which are stacked according to an embodiment of the present disclosure. Referring to FIG. 5, computer simulation is used, the first antireflection structure and the second antireflection structure in the embodiment are taken as a whole, and all film layers are optimized as a whole, with a reflectivity less than or equal to 0.188% and a transmittance greater than or equal to 98.96% in the visible light band. The existence of a conductive layer refers to that the first antireflection structure is a touch pad, and the nonexistence of a conductive layer refers to that no conductive layer is disposed in the first antireflection structure. As can be seen from FIG. 5, the transmittance curve and the reflectivity curve in the existence of the conductive layer basically coincide with the transmittance curve and the reflectivity curve in the nonexistence of the conductive layer, respectively indicating that the conductive layer has little influence on the antireflection structure and a relatively good anti-shadow effect can be achieved when etching marks exist in the conductive layer.

Figure 6:
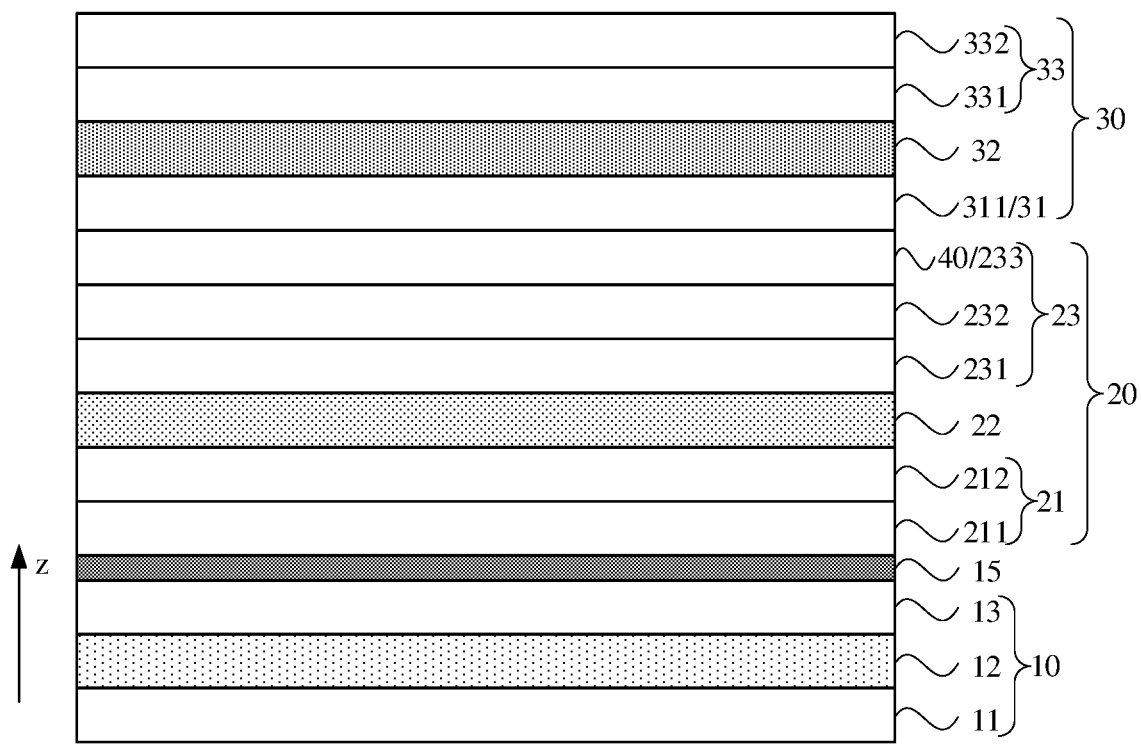
FIG. 6 is a structure diagram of another display device according to an embodiment of the present disclosure.

FIG. 6 is a structure diagram of another display device according to an embodiment of the present disclosure. Referring to FIG. 6, optionally, the display panel 10 further includes a second substrate 13 located on the side of the display functional layer 12 facing away from the driving substrate 11; and the first antireflection structure 20 is attached, through optical adhesive 15, to the side of the second substrate 13 facing away from the display functional layer 12.

It is to be understood that when the display panel 10 is a liquid crystal display panel, the second substrate 13 may be a color film substrate; when the display panel 10 is an organic light emitting display panel, the second substrate 13 may be an encapsulation substrate. In the embodiment, the first antireflection structure 20 is attached to the outside of the display panel 10 through the optical adhesive 15 to form an on-cell structure, which has the advantages of simple structure and low cost.

Figure 7:
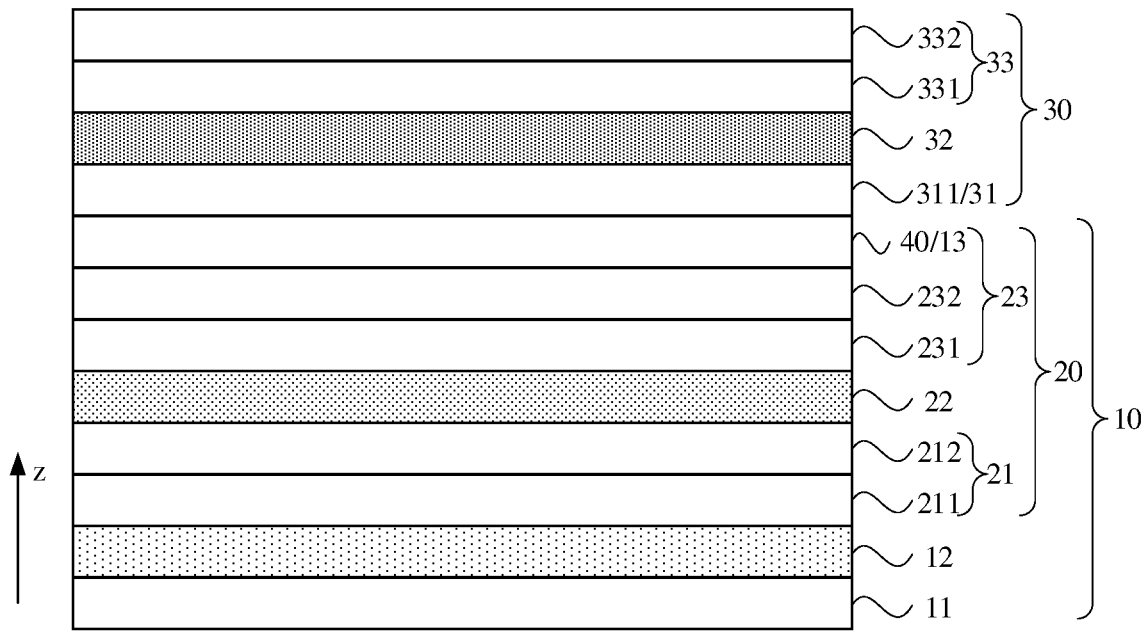
FIG. 7 is a structure diagram of another display device according to an embodiment of the present disclosure.

FIG. 7 is a structure diagram of another display device according to an embodiment of the present disclosure. Referring to FIG. 7, optionally, the display panel 10 further includes a second substrate 13 located on the side of the display functional layer 12 facing away from the driving substrate 11; and the second substrate 13 is used as the first substrate 40.

It is to be understood that in the embodiment, the second substrate 13 is used as the first substrate 40, so that the first antireflection structure can be disposed inside the display panel, being beneficial to reducing the number of film layers of the display device and achieving the lightness and thinness of the display device.

Figure 8:
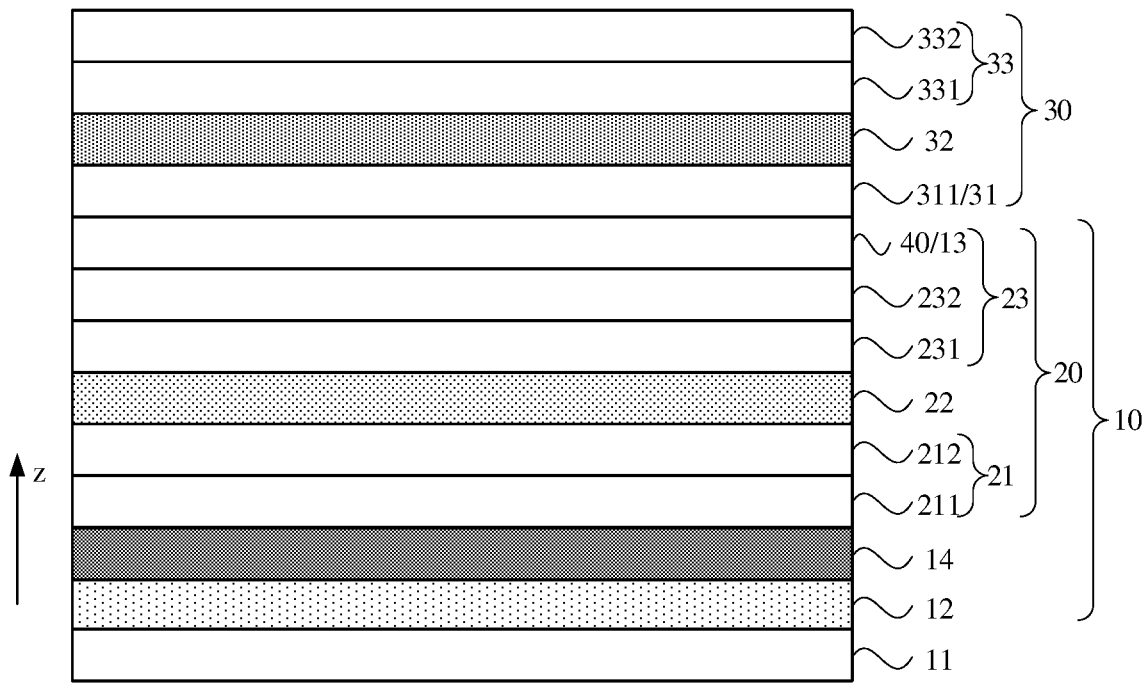
FIG. 8 is a structure diagram of another display device according to an embodiment of the present disclosure.

When the display device is a liquid crystal display device, a color resist layer needs to be disposed on the light emitting side of the display panel. Exemplarily, FIG. 8 is a structure diagram of another display device according to an embodiment of the present disclosure. Referring to FIG. 8, optionally, the display device provided in the embodiment further includes a color resist layer 14. The color resist layer 14 is located between the first graded-index layer 21 and the display functional layer 12.

It is to be understood that the color resist layer 14 may include a red color resist, a green color resist, a blue color resist, and a black matrix. The position and type of each color resist are not shown in FIG. 8. The three types of color resists respectively emit light of corresponding colors. The black matrix is used to shield the driving circuit on the driving substrate 11, and the specific shape and arrangement of the color resists can be set according to actual situations and are not limited in the embodiment of the present disclosure.

Optionally, the display device provided in the embodiment further includes a polarizer; the polarizer is disposed on the side of the fourth graded-index layer facing away from the first dielectric layer, or between the third graded-index layer and the first substrate, or between the second graded-index layer and the first substrate, or on the side of the first graded-index layer facing away from the conductive layer.

Figure 9:
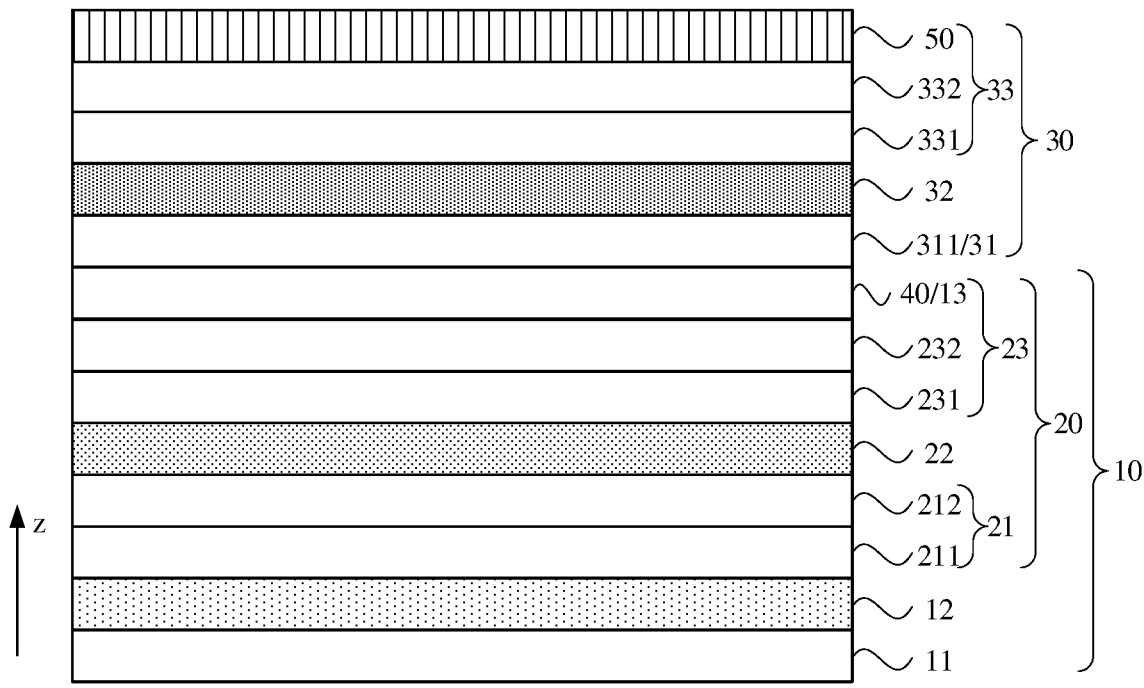
FIGS. 9 to 12 are structure diagrams of another display devices, respectively, according to an embodiment of the present disclosure.
Figure 10:
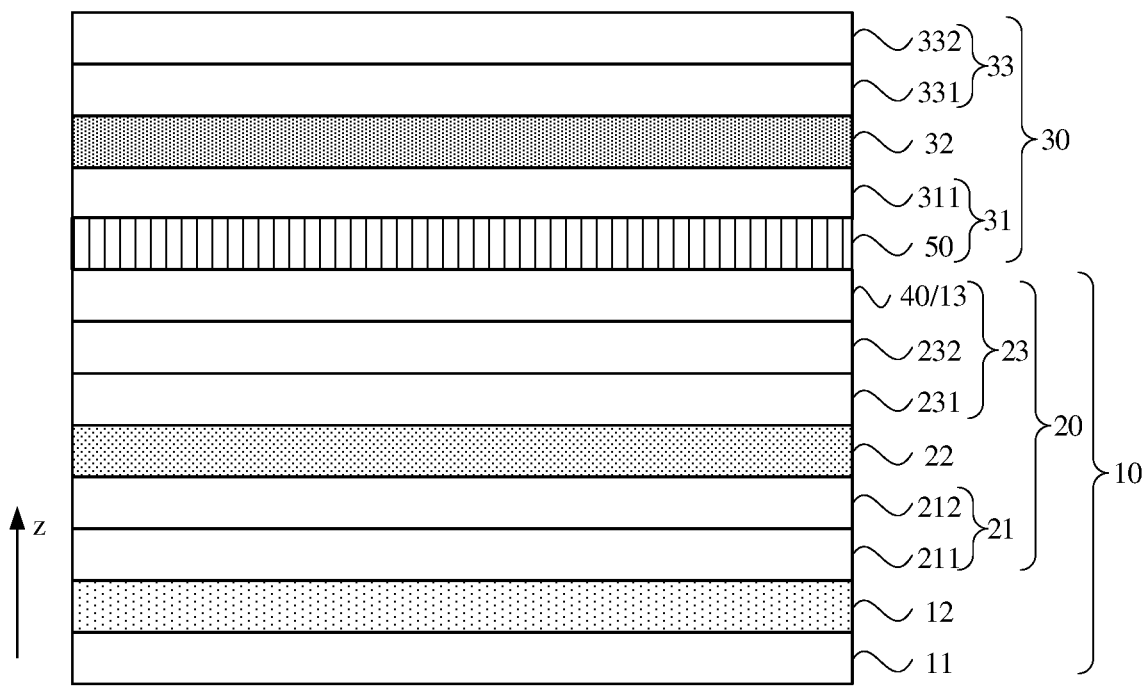
Figure 11:
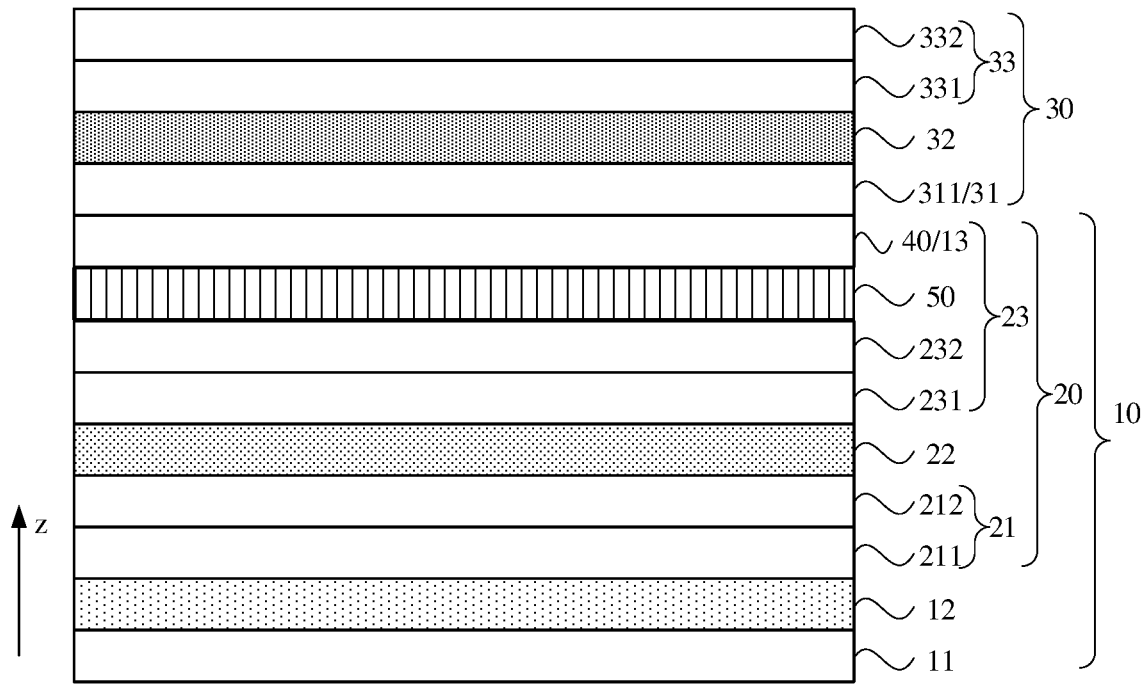
Figure 12:
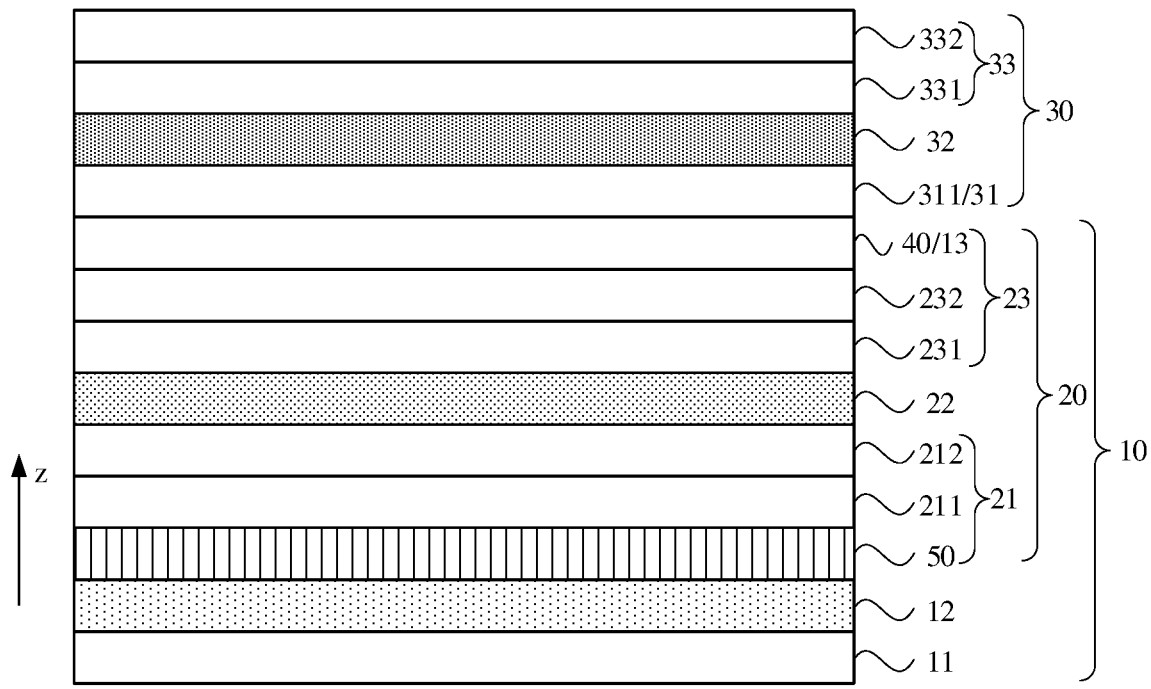

It is to be understood that when the display device is a liquid crystal display device, the polarizer may be a linear polarizer, and when the display device is an organic light emitting display device, the polarizer may be a circular polarizer. Exemplarily, FIGS. 9 to 12 are structure diagrams of another display devices, respectively, according to an embodiment of the present disclosure. Referring to FIG. 9, the polarizer 50 is disposed on the side of the fourth graded-index layer 33 facing away from the first dielectric layer 32. In specific implementation, the refractive index of the polarizer 50 may be set to be less than the refractive index of the fourth sublayer adjacent to the polarizer 50, so that the polarizer 50 is regarded as one sublayer of the fourth graded-index layer 33. Referring to FIG. 10, the polarizer 50 is disposed between the third graded-index layer 31 and the first substrate 40. In specific implementation, the refractive index of the polarizer 50 may be set to be greater than or equal to the refractive index of the first substrate 40 and less than the refractive index of the third sublayer adjacent to the polarizer 50, so that the polarizer 50 is regarded as one sublayer of the third graded-index layer 31. Referring to FIG. 11, the polarizer 50 is disposed between the second graded-index layer 23 and the first substrate 40. In specific implementation, the refractive index of the polarizer 50 may be set to be greater than the refractive index of the first substrate 40 and less than the refractive index of the second sublayer adjacent to the polarizer 50, so that the polarizer 50 is regarded as one sublayer of the second graded-index layer 23. Referring to FIG. 12, the polarizer 50 is disposed on the side of the first graded-index layer 21 facing away from the conductive layer 22. In specific implementation, the refractive index of the polarizer 50 may be set to be less than the refractive index of the first sublayer adjacent to the polarizer 50, so that the polarizer 50 is regarded as one sublayer of the first graded-index layer 21.

In other embodiments, if process conditions permit, the polarizer may also be disposed inside the first antireflection structure or the second antireflection structure, as long as the refractive index of the polarizer satisfies the refractive index change rule among the film layers.

In the above several embodiments, the first antireflection structure and the second antireflection structure are respectively located on two sides of the first substrate; in the preparation process, one antireflection structure is generally formed on one side and then the other antireflection structure is formed on the other side. In this way, defects such as scratches may be caused to the previously formed structure during the preparation process, and therefore, in another embodiment, two antireflection structures can be disposed on the same side of the first substrate.

Optionally, the display device provided in the embodiment of the present disclosure further includes a first substrate, where the first substrate is a first sublayer close to the display functional layer.

Figure 13:
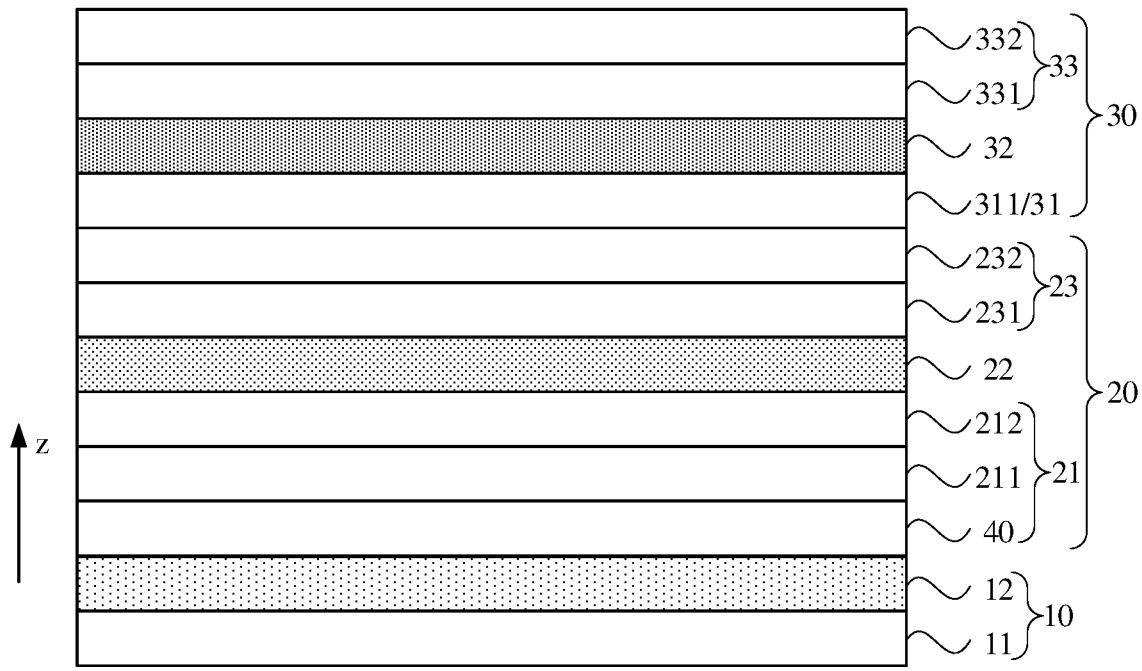
FIG. 13 is a structure diagram of another display device according to an embodiment of the present disclosure.

Exemplarily, FIG. 13 is a structure diagram of another display device according to an embodiment of the present disclosure. Referring to FIG. 13, the display device further includes a first substrate 40, where the refractive index of the first substrate 40 is less than the refractive index of the first sublayer 211 adjacent to the first substrate 40. In specific implementation, the first substrate 40 may be a glass substrate. In the embodiment, the first substrate 40 is used as the sublayer of the first graded-index layer 21 closest to the display functional layer 12 and may be simultaneously used as one sublayer of the first graded-index layer 21 so that the first graded-index layer in which the refractive index gradually increases in the z direction is formed.

Figure 14:
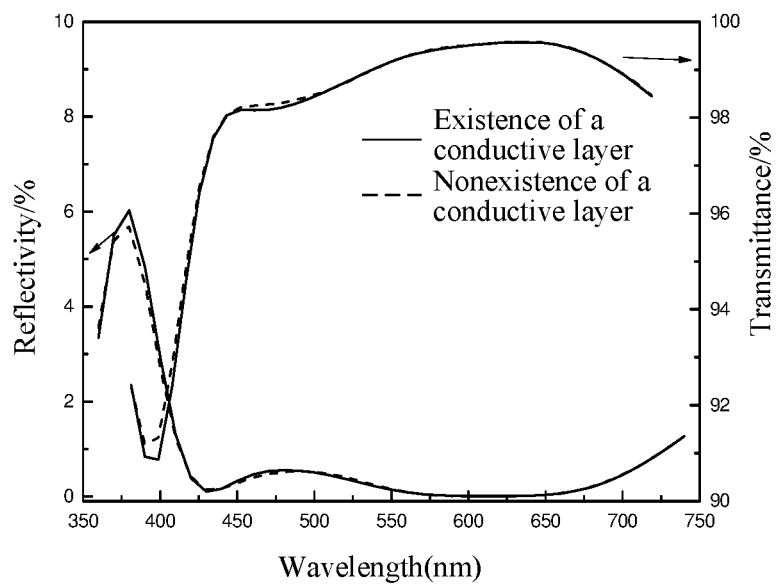
FIG. 14 is a schematic diagram illustrating another simulation results of transmittance and reflectivity of a first antireflection structure and a second antireflection structure which are stacked according to an embodiment of the present disclosure.

FIG. 14 is a schematic diagram illustrating another simulation results of transmittance and reflectivity of a first antireflection structure and a second antireflection structure which are stacked according to an embodiment of the present disclosure. Referring to FIG. 14, computer simulation is used, the reflectivity is less than or equal to 0.175% and the transmittance is greater than or equal to 99.13% in the visible light band. The existence of a conductive layer refers to that the first antireflection structure is a touch pad, and the nonexistence of a conductive layer refers to that no conductive layer is disposed in the first antireflection structure. As can be seen from FIG. 14, the transmittance curve and the reflectivity curve in the existence of the conductive layer basically coincide with the transmittance curve and the reflectivity curve in the nonexistence of the conductive layer, respectively, indicating that the conductive layer has little influence on the antireflection structure and can play a relatively good anti-shadow effect when etching marks exist in the conductive layer.

Figure 15:
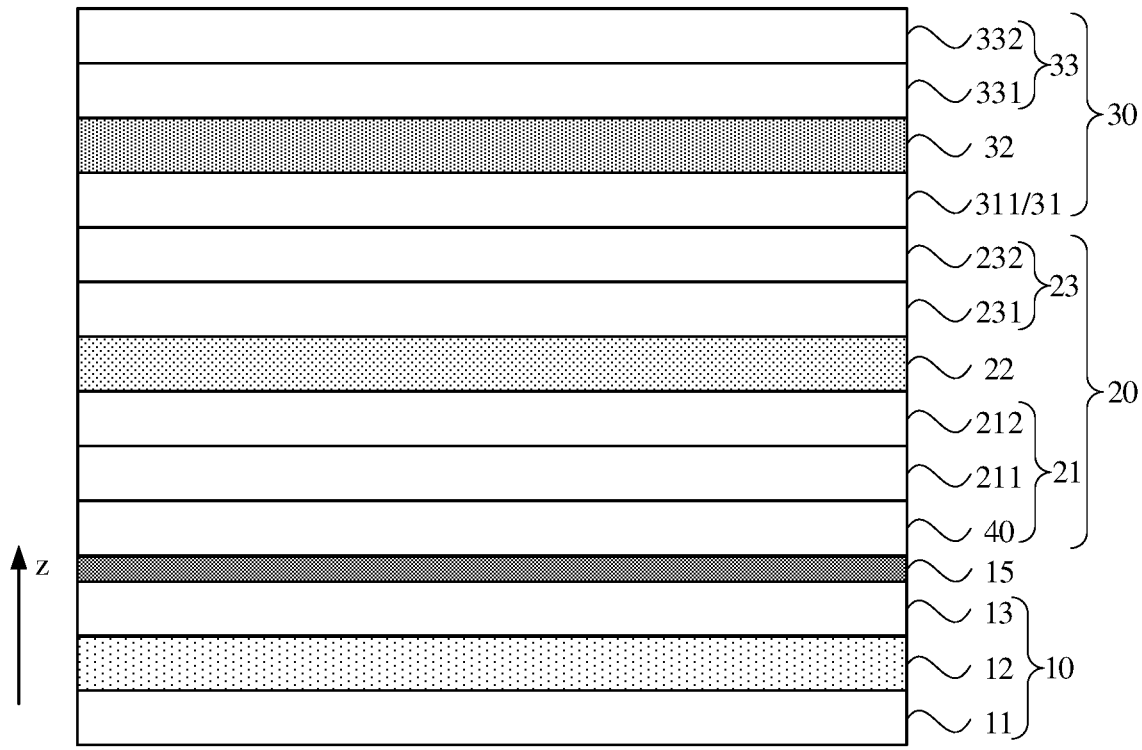
FIG. 15 is a structure diagram of another display device according to an embodiment of the present disclosure.

FIG. 15 is a structure diagram of another display device according to an embodiment of the present disclosure. Referring to FIG. 15, optionally, the display panel 10 further includes a second substrate 13 located on the side of the display functional layer 12 facing away from the driving substrate 11; and the first substrate 40 is attached, through optical adhesive 15, to the side of the second substrate 13 facing away from the display functional layer 12.

It is to be understood that when the display panel 10 is a liquid crystal display panel, the second substrate 13 may be a color film substrate; when the display panel 10 is an organic light emitting display panel, the second substrate 13 may be a package substrate. In the embodiment, the first substrate 40 is attached to the outside of the display panel 10 through the optical adhesive 15 to form an on-cell structure, which has the advantages of simple structure and low cost.

Figure 16:
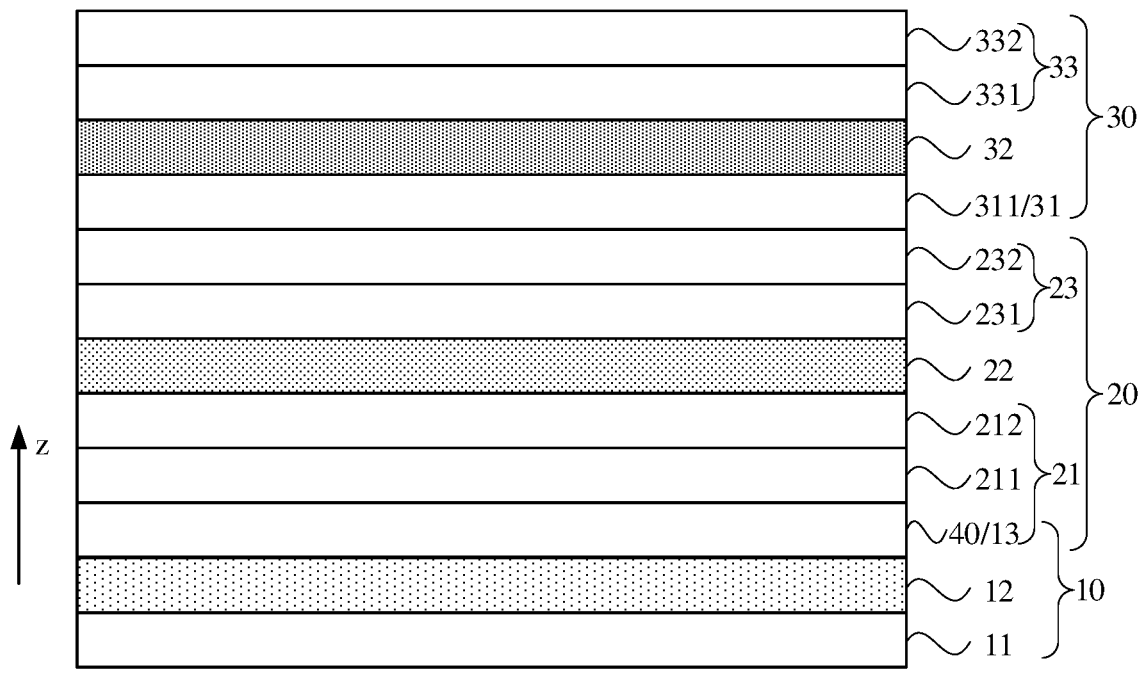
FIG. 16 is a structure diagram of another display device according to an embodiment of the present disclosure.

FIG. 16 is a structure diagram of another display device according to an embodiment of the present disclosure. Referring to FIG. 16, optionally, the display panel 10 further includes a second substrate 13 located on the side of the display functional layer 12 facing away from the driving substrate 11; and the second substrate 13 is used as the first substrate 40.

It is to be understood that in the embodiment, the second substrate 13 is used as the first substrate 40, being beneficial to reducing the number of film layers of the display device and achieving the lightness and thinness of the display device.

Figure 17:
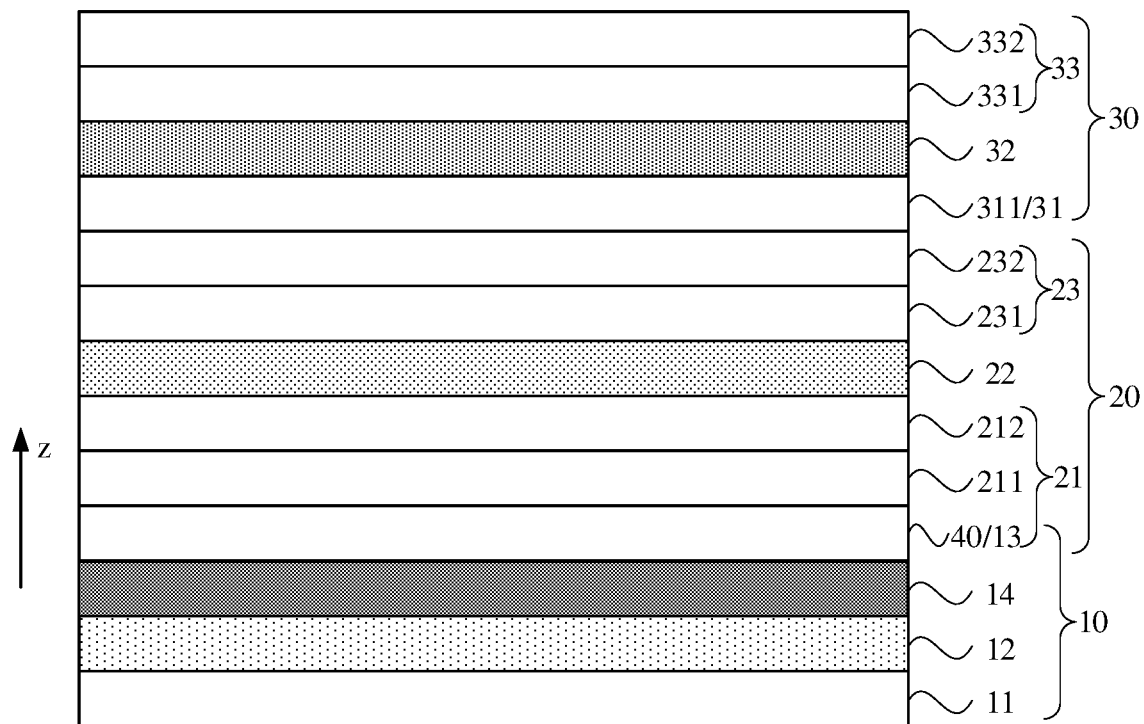
FIG. 17 is a structure diagram of another display device according to an embodiment of the present disclosure.

When the display device is a liquid crystal display device, a color resist layer needs to be disposed on the light emitting side of the display panel. FIG. 17 is a structure diagram of another display device according to an embodiment of the present disclosure. Referring to FIG. 17, optionally, the display device provided in the embodiment further includes a color resist layer 14. The color resist layer 14 is located on the side of the second substrate 13 facing away from the first graded-index layer 21.

It is to be understood that the color resist layer 14 may include a red color resist, a green color resist, a blue color resist, and a black matrix. The position and type of each color resist are not shown in FIG. 17. The three types of color resists respectively emit light of corresponding colors. The black matrix is used to shield the driving circuit on the driving substrate 11, and the specific shape and arrangement of the color resists can be set according to actual situations and are not limited in the embodiment of the present disclosure.

Optionally, the display device provided in the embodiment further includes a polarizer; the polarizer is disposed on the side of the fourth graded-index layer facing away from the first dielectric layer, or between the third graded-index layer and the second graded-index layer, or between the first graded-index layer and the first substrate, or on the side of the first substrate facing away from the first graded-index layer.

Figure 18:
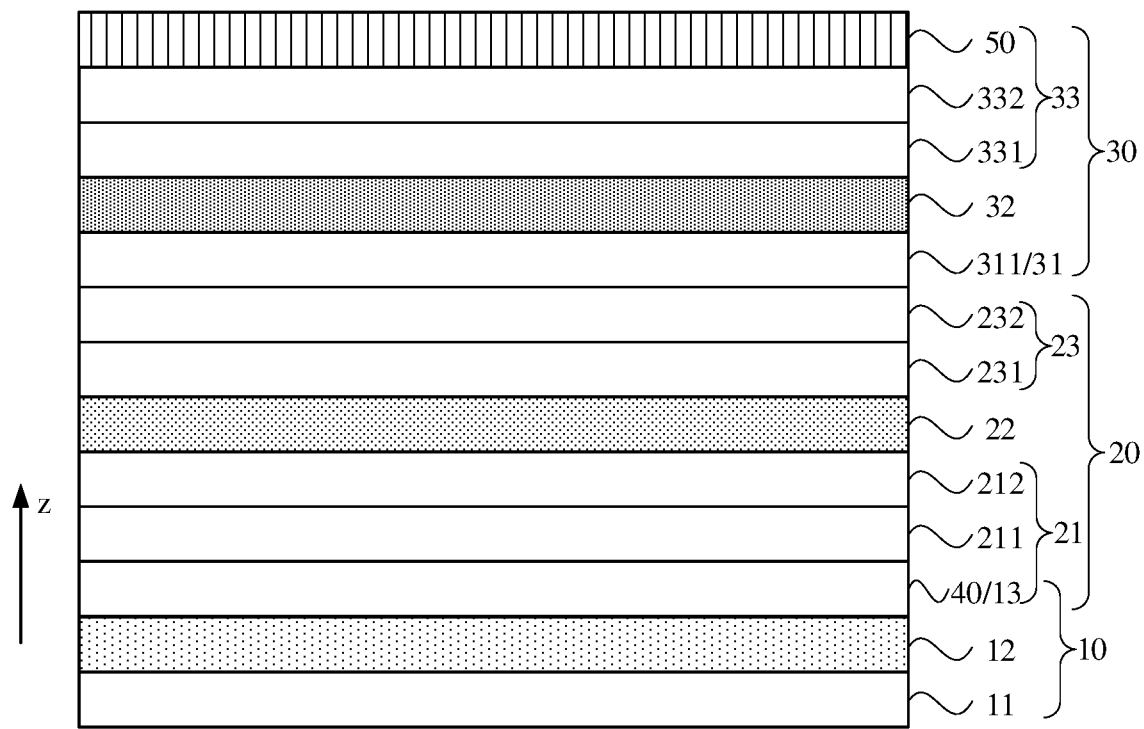
FIGS. 18 to 21 are structure diagrams of another display devices, respectively, according to an embodiment of the present disclosure.
Figure 19:
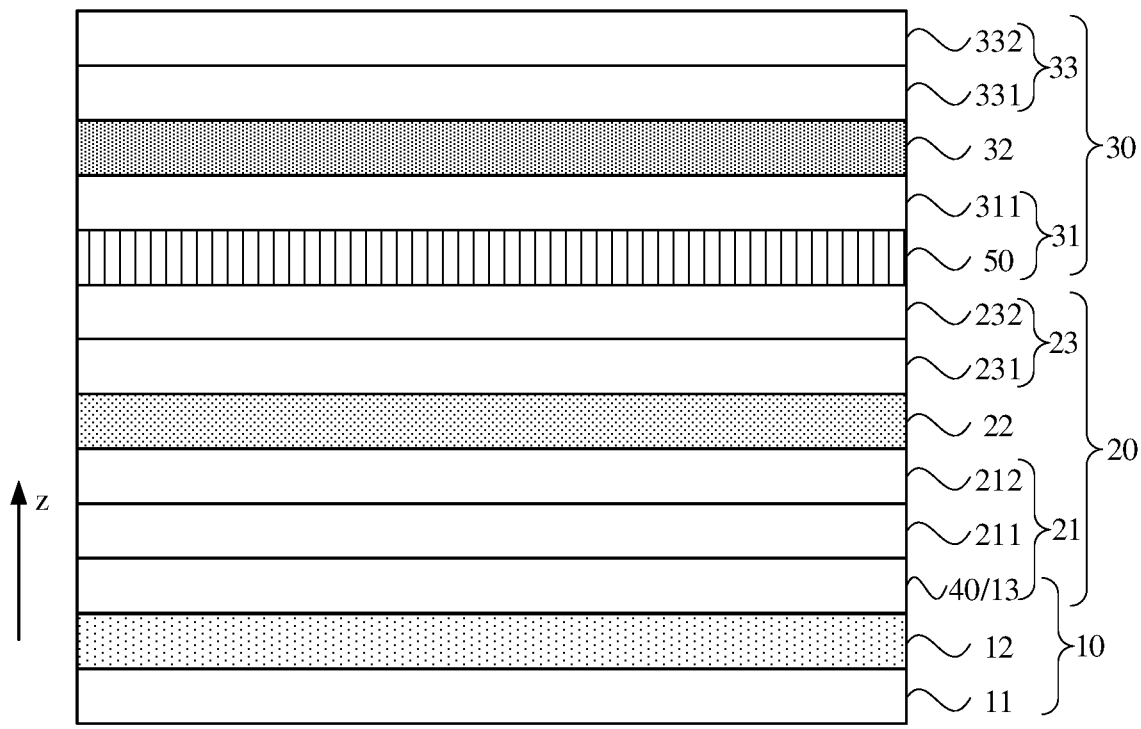
Figure 20:
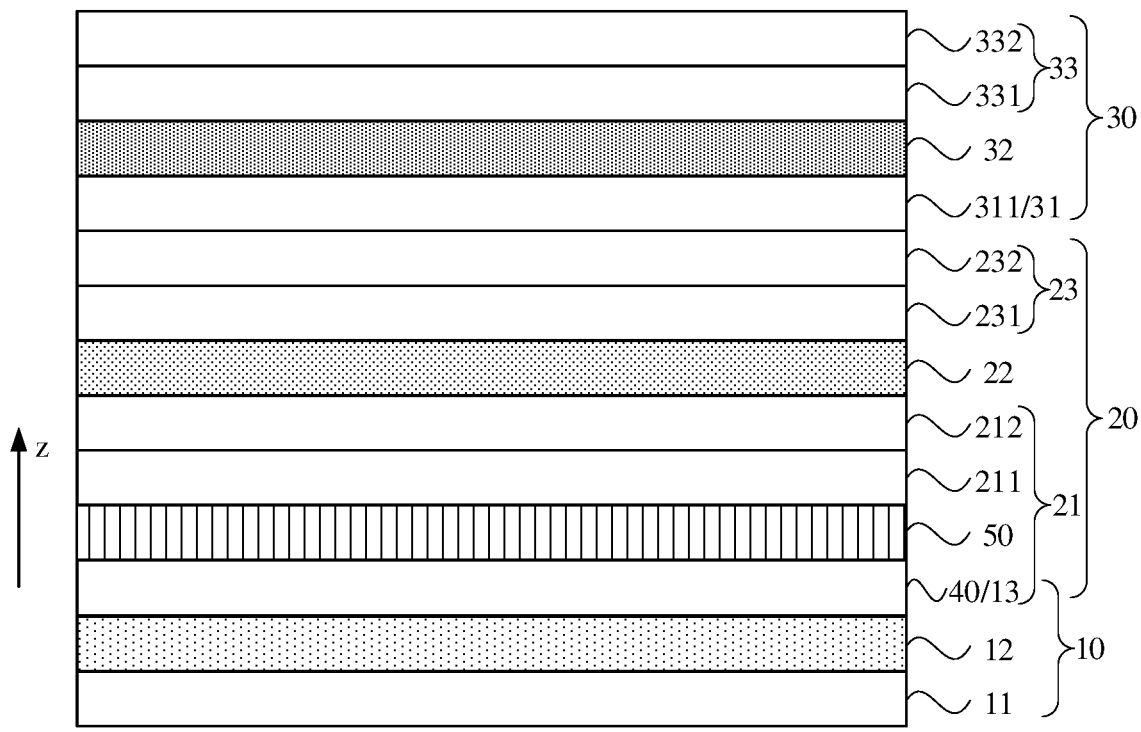
Figure 21:
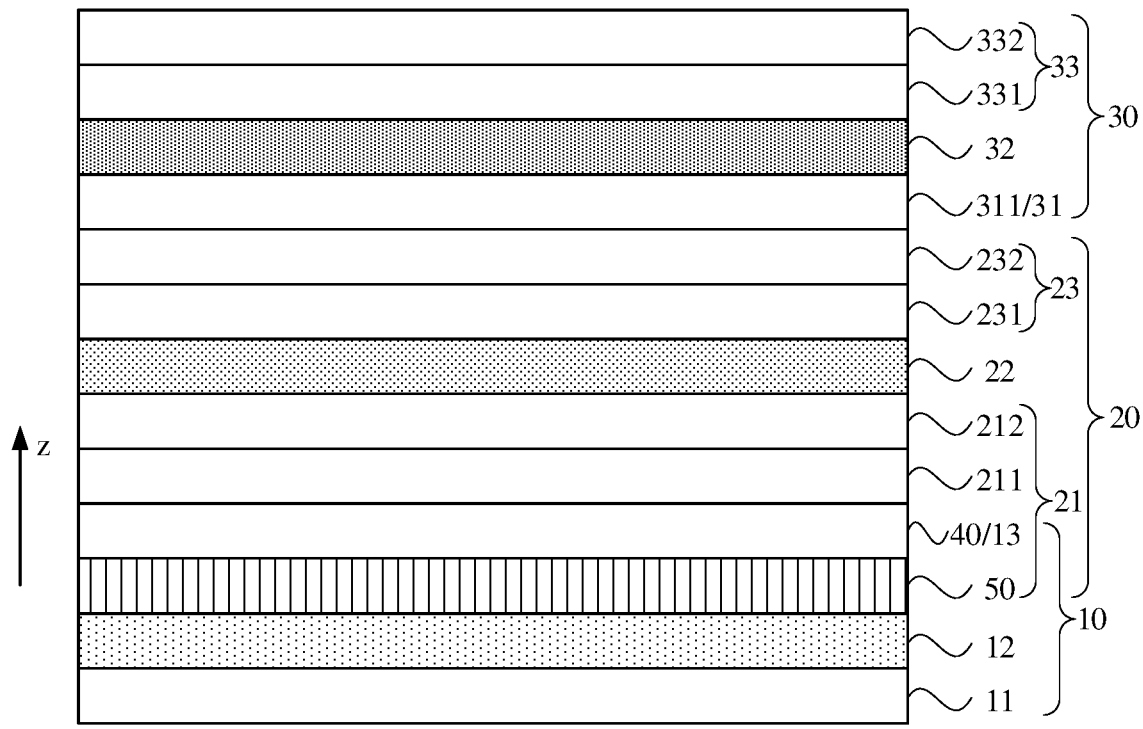

When the display device is a liquid crystal display device, the polarizer may be a linear polarizer, and when the display device is an organic light emitting display device, the polarizer may be a circular polarizer. Exemplarily, FIGS. 18 to 21 are structure diagrams of another display devices, respectively, according to an embodiment of the present disclosure. Referring to FIG. 18, the polarizer 50 is disposed on the side of the fourth graded-index layer facing away from the first dielectric layer 32. In specific implementation, the refractive index of the polarizer 50 may be set to be less than the refractive index of the fourth sublayer adjacent to the polarizer 50, so that the polarizer 50 is regarded as one sublayer of the fourth graded-index layer 33. Referring to FIG. 19, the polarizer 50 is disposed between the third graded-index layer 31 and the second graded-index layer 23. In specific implementation, the refractive index of the polarizer 50 may be set to be greater than or equal to the refractive index of the second sublayer adjacent to the polarizer 50, and less than the refractive index of the third sublayer adjacent to the polarizer 50, so that the polarizer 50 is regarded as one sublayer of the second graded-index layer 23 or third graded-index layer 31 (By way of example, the polarizer 50 is regarded as one sublayer of the third graded-index layer 31 in FIG. 19). Referring to FIG. 20, the polarizer 50 is disposed between the first graded-index layer 21 and the first substrate 40. In specific implementation, the refractive index of the polarizer 50 may be set to be greater than the refractive index of the first substrate 40 and less than the refractive index of the first sublayer adjacent to the polarizer 50, so that the polarizer 50 is regarded as one sublayer of the first graded-index layer 21. Referring to FIG. 21, the polarizer 50 is disposed on the side of the first substrate 40 facing away from the first graded-index layer 21. In specific implementation, the refractive index of the polarizer 50 may be set to be less than the refractive index of the first substrate 40.

In other embodiments, if process conditions permit, the polarizer may also be disposed inside the first antireflection structure or the second antireflection structure, as long as the refractive index of the polarizer satisfies the refractive index change rule among the film layers.

Optionally, the display device provided in the embodiment further includes a first substrate, where the first substrate is the fourth sublayer farthest from the display functional layer.

Figure 22:
FIG. 22 is a structure diagram of another display device according to an embodiment of the present disclosure.

Exemplarily, FIG. 22 is a structure diagram of another display device according to an embodiment of the present disclosure. Referring to FIG. 22, the display device further includes a first substrate 40, where the refractive index of the first substrate 40 is less than the refractive index of the fourth sublayer 332 adjacent to the first substrate 40. In specific implementation, the first substrate 40 may be a glass substrate, being beneficial to enhancing the mechanical strength of the antireflection structure.

Optionally, the display device may further include a color resist layer, a polarizer, and other structures, and the arrangement manner is similar to the manner in the above embodiment.

In the above embodiment, optionally, the first graded-index layer, the second graded-index layer, the third graded-index layer and the fourth graded-index layer each include nitrogen oxide; in the direction in which the first graded-index layer points to the conductive layer, mass proportions of nitrogen in the first graded-index layer gradually increase, mass proportions of oxygen in the first graded-index layer gradually decrease, mass proportions of nitrogen in the second graded-index layer gradually decrease, mass proportions of oxygen in the second graded-index layer gradually increase, mass proportions of nitrogen in the third graded-index layer gradually increase, mass proportions of oxygen in the third graded-index layer gradually decrease, mass proportions of nitrogen in the fourth graded-index layer gradually decrease, and mass proportions of oxygen in the fourth graded-index layer gradually increase.

In specific implementation, silicon oxynitride may be used, and the refractive index of silicon oxynitride may gradually change between 1.45 and 2. The refractive index change can be achieved through a control of the inlet flow of different gases during preparation. In other embodiments, the graded-index layer may also be made of aluminum nitrogen oxides, metal halides or other materials, as long as a material with an adjustable element ratio is selected to prepare the film layer with variable refractive index. Selection can be flexibly made according to the actual preparation process during specific implementation, and is not limited in the embodiments of the present disclosure.

Optionally, the number of first sublayers is the same as the number of second sublayers, and refractive indexes of a first sublayer and a second sublayer at symmetrical positions with respect to the conductive layer are the same; the number of third sublayers is the same as the number of fourth sublayers, and refractive indexes of a third sublayer and a fourth sublayer at symmetrical positions with respect to the first dielectric layer are the same.

Exemplarily, silicon oxynitride is taken as an example, and four first sublayers and four second sublayers may be provided, where the first sublayers are successively set and successively designed as $SiO_{0.7}N_{0.3}$, $SiO_{0.5}N_{0.5}$, $SiO_{0.3}N_{0.7}$ and $SiO_{0.2}N_{0.8}$, and the second sublayers are successively designed as $SiO_{0.2}N_{0.8}$, $SiO_{0.3}N_{0.7}$, $SiO_{0.5}N_{0.5}$ and $SiO_{0.7}N_{0.3}$; and the specific design may be selected according to actual conditions.

Figure 23:
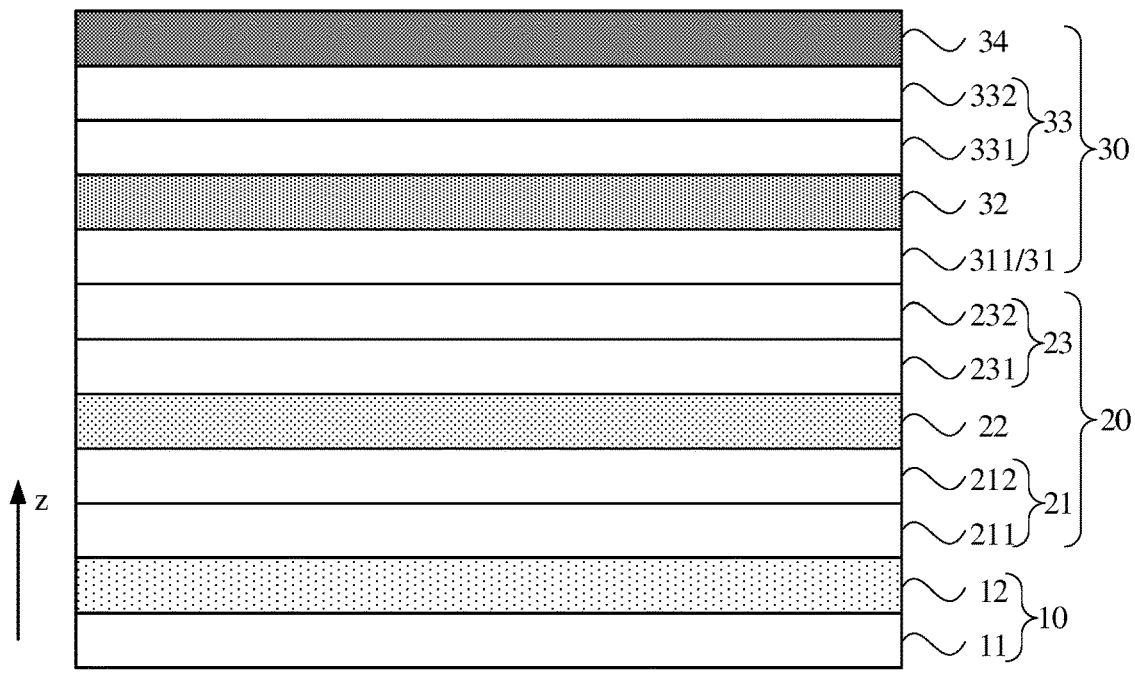
FIG. 23 is a structure diagram of another display device according to an embodiment of the present disclosure.

FIG. 23 is a structure diagram of another display device according to an embodiment of the present disclosure. Referring to FIG. 23, optionally, in the display device provided in the embodiment, the second antireflection structure 30 further includes a second dielectric layer 34 disposed on the side of the fourth graded-index layer 33 facing away from the first dielectric layer 32, and the refractive index of the second dielectric layer 34 is less than the refractive index of the fourth sublayer 332 adjacent to the second dielectric layer 34.

When the fourth graded-index layer 33 is formed of silicon oxynitride materials, and the uppermost sublayer of the fourth graded-index layer 33 is formed of silicon oxide having a refractive index of about 1.45, there is still a certain difference between the refractive index of the fourth graded-index layer 33 and the refractive index of air. In order to match the refractive index of the fourth graded-index layer 33 at the light emitting surface with the refractive index of the air, a second dielectric layer 34 having a lower refractive index can be disposed, thereby avoiding too large a change in the refractive index at the light emitting interface and improving the display quality.

In specific implementation, a material having the lowest possible refractive index is selected for the second dielectric layer 34, for example, fluoride or fluorine-containing acrylate polymer or prepolymer having a low refractive index may be used to adjust the refractive index of the film layer. Optionally, the second dielectric layer 34 includes magnesium fluoride, a copolymer of fluorine-containing (meth) acrylates, a copolymer of vinylidene fluoride and tetrafluoroethylene, a copolymer of fluorine-containing monofunctional (meth) acrylates or fluorine-containing difunctional (meth) acrylates and polyfunctional (meth) acrylates, such fluorine-containing polymers having a refractive index generally between 1.25 and 1.45. In addition, when magnesium fluoride is selected for the second dielectric layer 34, fingerprints can be prevented from being left during touch by a finger, thus improving the display effect. In other embodiments, the material of the second dielectric layer 34 is not limited to the above material, as long as the second dielectric layer 34 is provided to be the material having the lowest refractive index in the second antireflection structure.

Optionally, the conductive layer includes at least one transparent conductive layer, and forms a touch electrode layer.

It is to be understood that the touch electrode layer in the embodiment may form a self-capacitive touch electrode or a mutual capacitive touch electrode, and the first antireflection structure may be formed outside the display panel in an on-cell manner or integrated inside the display panel.

Figure 24:
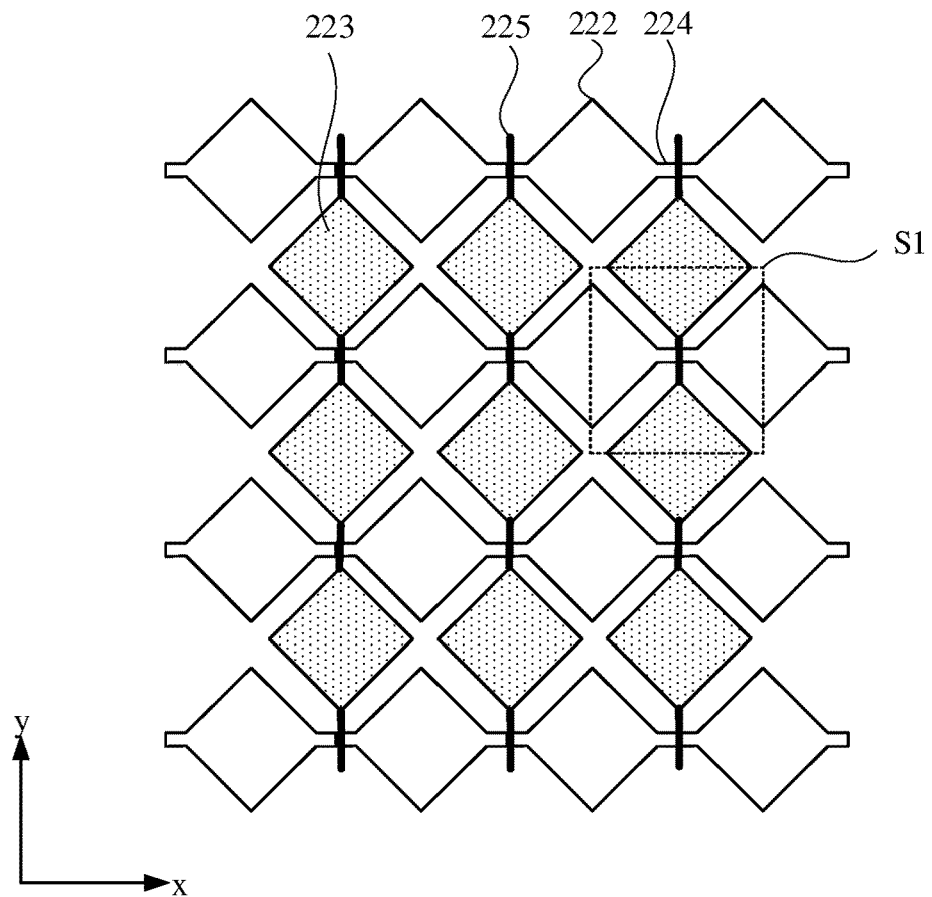
FIG. 24 is a top view of a conductive layer according to an embodiment of the present disclosure.
Figure 25:
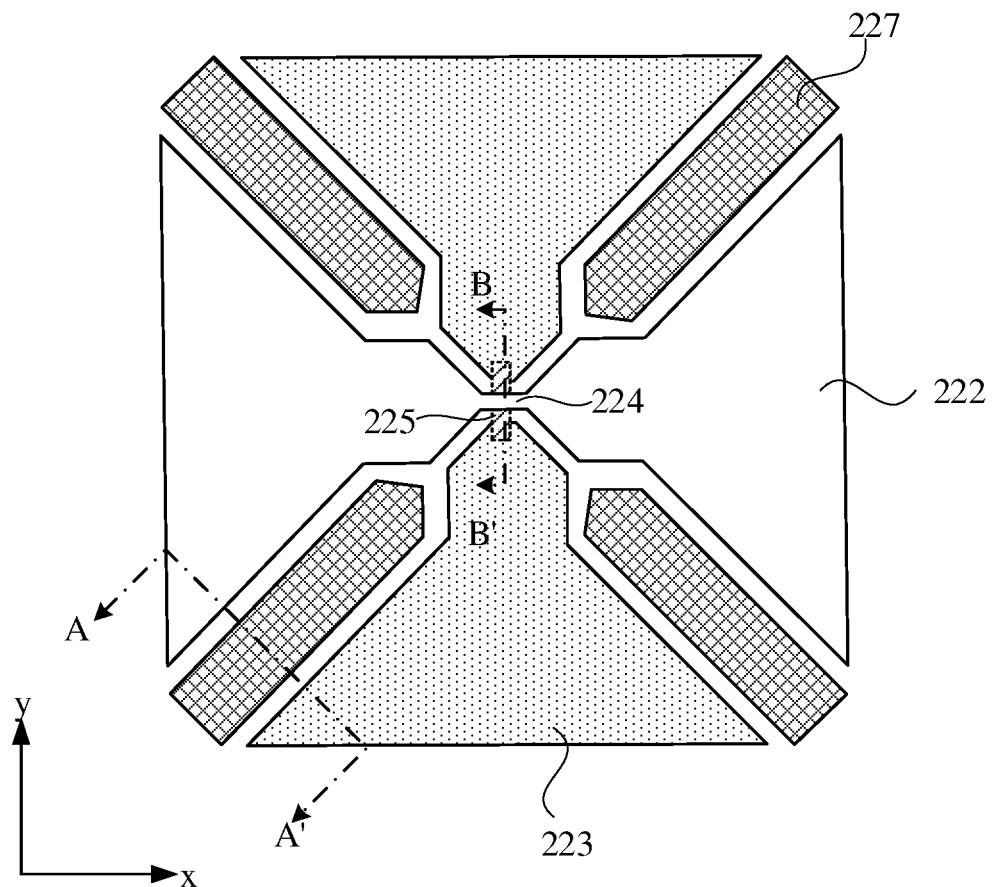
FIG. 25 is an enlarged view of a region S1 of FIG. 24.
Figure 26:
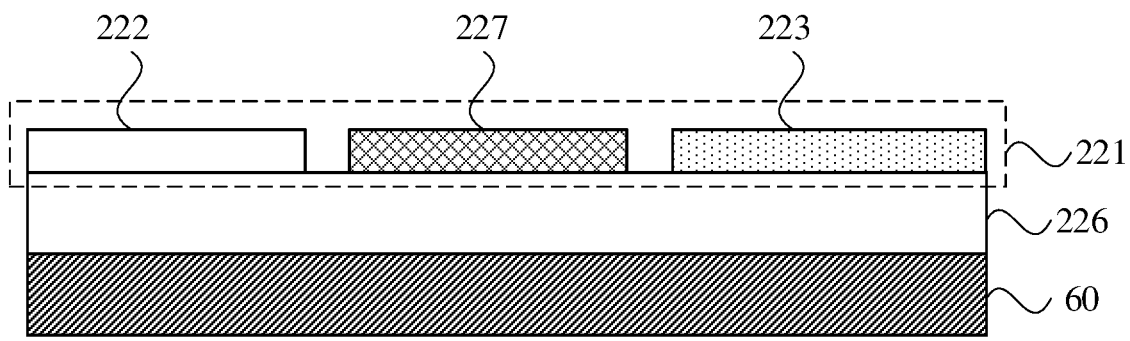
FIG. 26 is a cross-sectional view taken along line AA' of FIG. 25.
Figure 27:
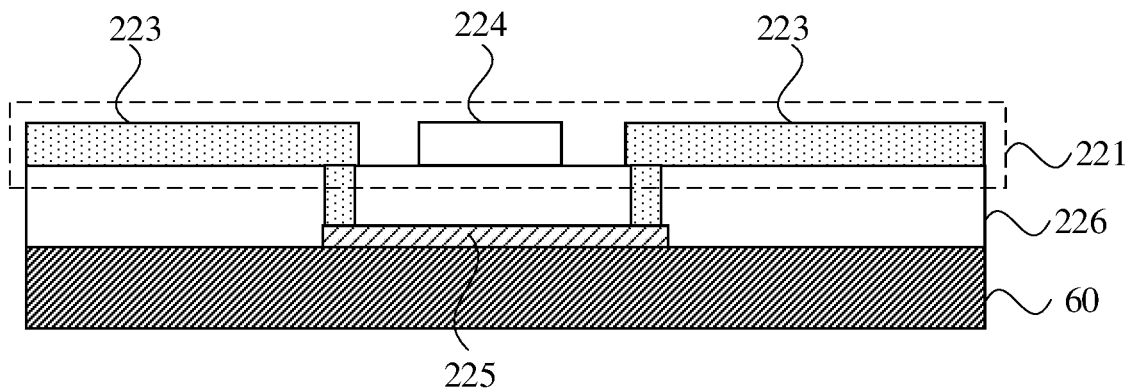
FIG. 27 is a cross-sectional view taken along line BB' of FIG. 25.

The mutual capacitive touch electrode is taken as an example, FIG. 24 is a top view of a conductive layer according to an embodiment of the present disclosure, FIG. 25 is an enlarged view of a region S1 of FIG. 24, FIG. 26 is a cross-sectional view taken along line AA' of FIG. 25, and FIG. 27 is a cross-sectional view taken along line BB' of FIG. 25. Referring to FIGS. 24 to 27, optionally, the transparent conductive layer includes a first transparent conductive layer 221. The first transparent conductive layer 221 includes a plurality of first touch electrodes 222 arranged in a matrix and a plurality of second touch electrodes 223 arranged in a matrix. Adjacent first touch electrodes 222 in a same matrix row are electrically connected through a first connecting portion 224, and adjacent second touch electrodes 223 in a same matrix column are electrically connected through a second connecting portion 225. The first connecting portion 224 and the first touch electrodes 222 are disposed at a same layer. The conductive layer further includes a first insulating layer 226, and the first insulating layer 226 is located between a plane where the second connecting portion 225 is located and a plane where the second touch electrodes 223 are located. The refractive index of the first insulating layer 226 may be set to be less than the refractive index of the conductive layer and greater than the refractive index of the adjacent first sublayer, so that the first insulating layer 226 is regarded as a sublayer of the first graded-index layer.

Figure 28:
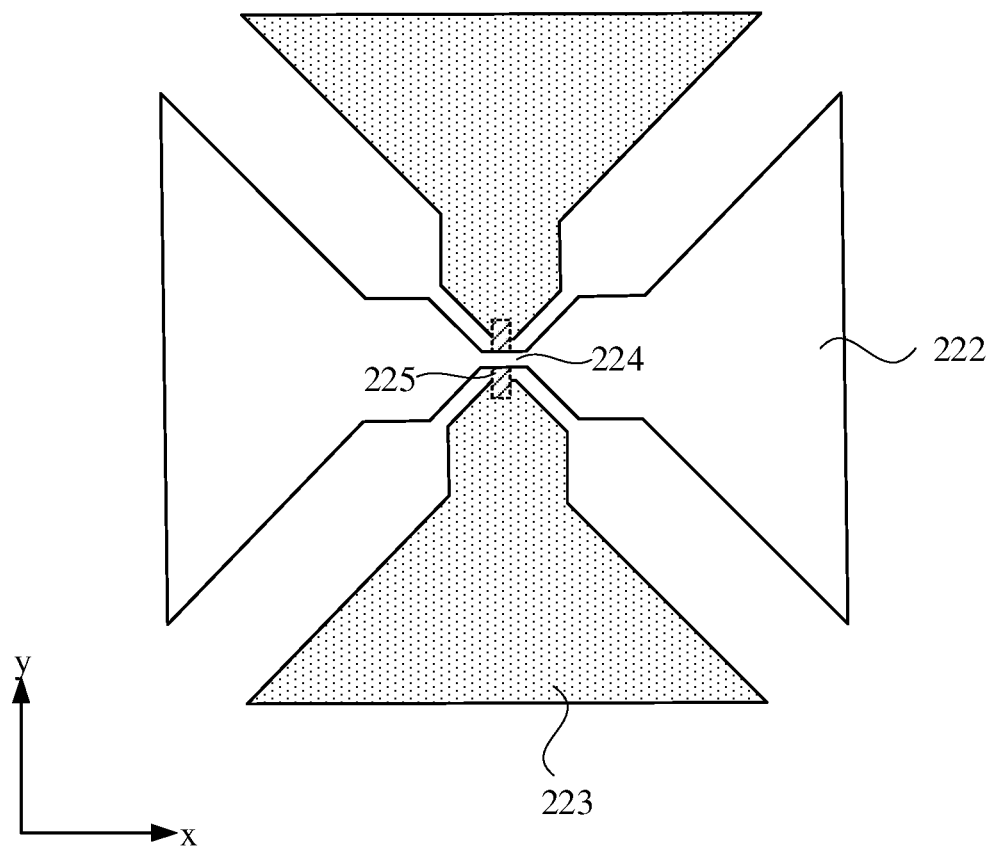
FIG. 28 is another enlarged view of the region S1 of FIG. 24.

The direction of the matrix row is the x direction shown in FIG. 24, and the direction of the matrix column is the y direction shown in FIG. 24. The first touch electrode 222 may be a touch driving electrode and the second touch electrode 223 may be a touch sensing electrode; alternatively, the first touch electrode 222 may be a touch sensing electrode and the second touch electrode 223 may be a touch driving electrode. Referring to FIGS. 25 and 26, optionally, the conductive layer further includes dummy electrodes 227 (dummy electrodes 227 are omitted in FIG. 24 to clearly illustrate the array formed by the first touch electrodes 222 and the second touch electrodes 223). In the embodiment, the first touch electrodes 222, the second touch electrodes 223 and the dummy electrodes 227 are disposed in the same layer, and can be formed in the same process by using the same material, thus saving the process and being beneficial to reducing the cost. In other embodiments, the touch pad may not be provided with dummy electrodes. Exemplarily, FIG. 28 is another enlarged view of the region S1 of FIG. 24. It is to be noted that shapes of the touch electrode and the dummy electrode in the figure are merely exemplary, may also be a diamond or other shapes designed according to design requirements, and are not limited herein. The first insulating layer 226 may be an inorganic layer, and optionally, the material of the inorganic layer may be silicon nitride or silicon oxynitride. The inorganic layer has a thinner thickness than an organic layer, being beneficial to reducing the thickness of the touch pad. In addition, due to the limitation of the manufacturing process, the organic layer cannot be manufactured to be less than 1 micron, and requires more time in the manufacturing process than the inorganic layer. Therefore, in the embodiment of the present disclosure, the inorganic layer is adopted to form the first insulating layer 22 in the touch pad, thus saving the manufacturing time of the touch pad and reducing the manufacturing difficulty.

Optionally, referring to FIGS. 26 and 27, the touch pad further includes a substrate 60, where the substrate 60 may be a rigid substrate such as a glass substrate, or a flexible substrate such as a polyimide substrate. The first touch electrodes 222, the second touch electrodes 223, and the dummy electrodes 227 are all located on the same side of the substrate 60.

Figure 29:
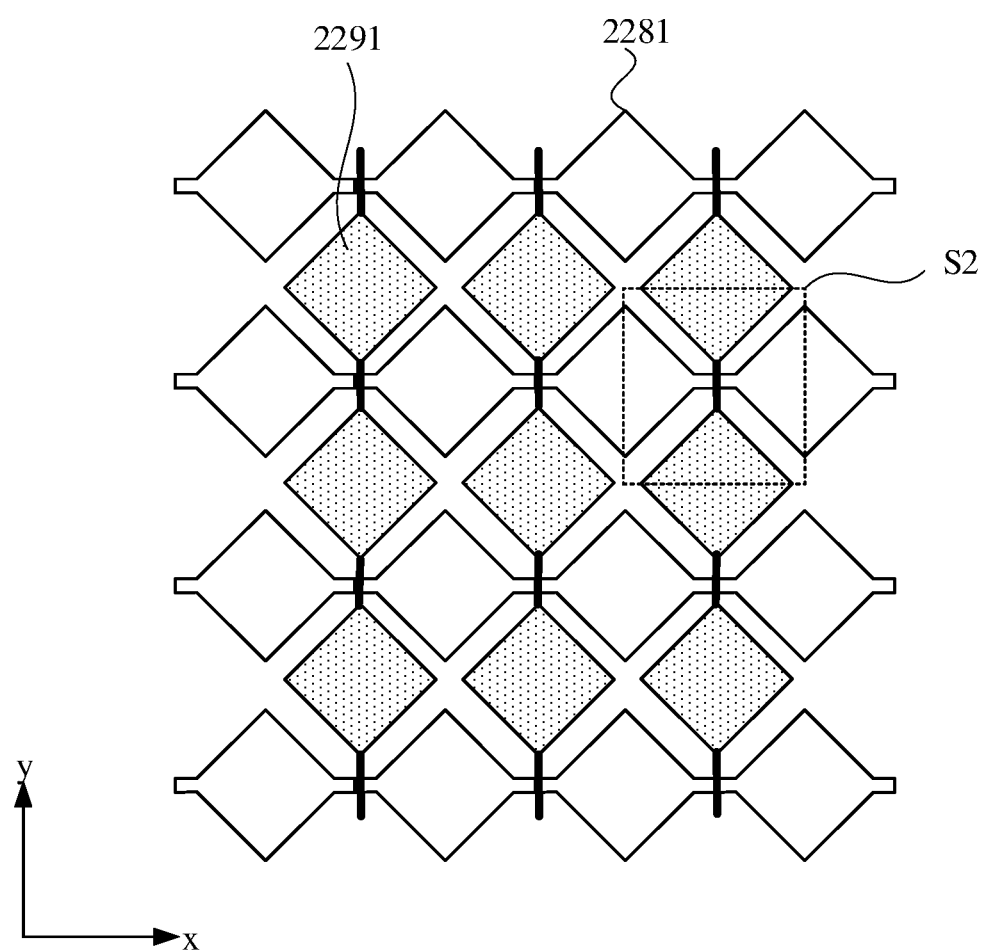
FIG. 29 is a top view of another conductive layer according to an embodiment of the present disclosure.
Figure 30:
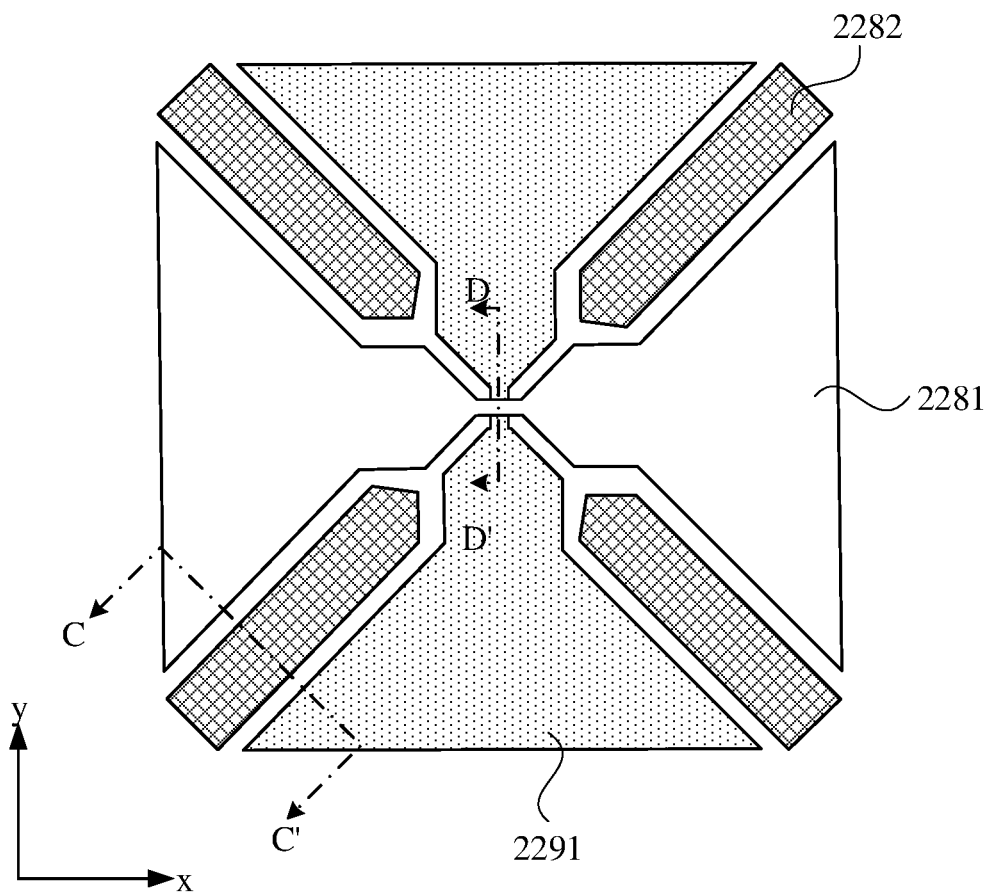
FIG. 30 is an enlarged view of a region S2 of FIG. 29.
Figure 31:
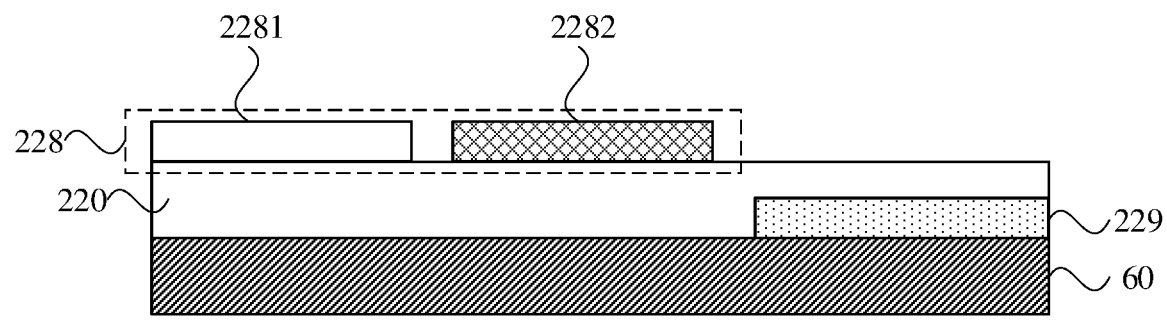
FIG. 31 is a cross-sectional view taken along line CC' of FIG. 30.
Figure 32:
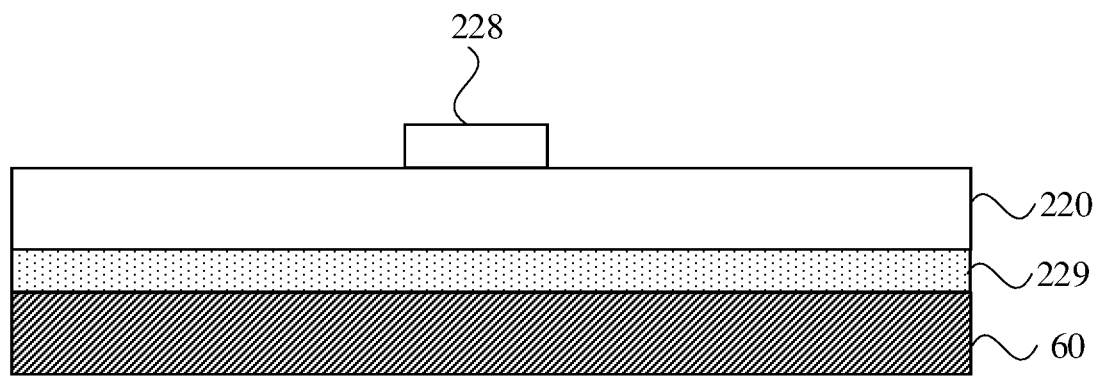
FIG. 32 is a cross-sectional view taken along line DD' of FIG. 30.

FIG. 29 is a top view of another conductive layer according to an embodiment of the present disclosure, FIG. 30 is an enlarged view of a region S2 of FIG. 29, FIG. 31 is a cross-sectional view taken along line CC' of FIG. 30, and FIG. 32 is a cross-sectional view taken along line DD' of FIG. 30. Referring to FIGS. 29 to 32, optionally, the conductive layer includes a second transparent conductive layer 228, a third transparent conductive layer 229, and a second insulating layer 220 located between the second transparent conductive layer 228 and the third transparent conductive layer 229. Optionally, the second insulating layer 220 may be silicon nitride or silicon oxynitride. The second transparent conductive layer 228 includes a plurality of third touch electrodes 2281 arranged in a matrix, and adjacent third touch electrodes 2281 in the same matrix row are electrically connected. The third transparent conductive layer 229 includes a plurality of fourth touch electrodes 2291 arranged in a matrix, and adjacent fourth touch electrodes 2291 in the same matrix column are electrically connected.

The third touch electrode 2281 may be a touch driving electrode and the fourth touch electrode 2291 may be a touch sensing electrode; alternatively, the third touch electrode 2281 may be a touch sensing electrode and the fourth touch electrode 2291 may be a touch driving electrode. Referring to FIG. 30, the touch pad further includes dummy electrodes 2282 (dummy electrodes 2282 are omitted in FIG. 29 to clearly illustrate the array formed by the third touch electrodes 2281 and the fourth touch electrodes 2291). Referring to FIG. 32, the dummy electrode 2282 is only schematically disposed in the second transparent conductive layer 228. In other embodiments, the dummy electrode 2282 may also be disposed in the third transparent conductive layer 229, or may be partially disposed in the second transparent conductive layer 228 and partially disposed in the third transparent conductive layer 229. Selection can be flexibly made according to actual requirements in specific implementation.

Figure 33:
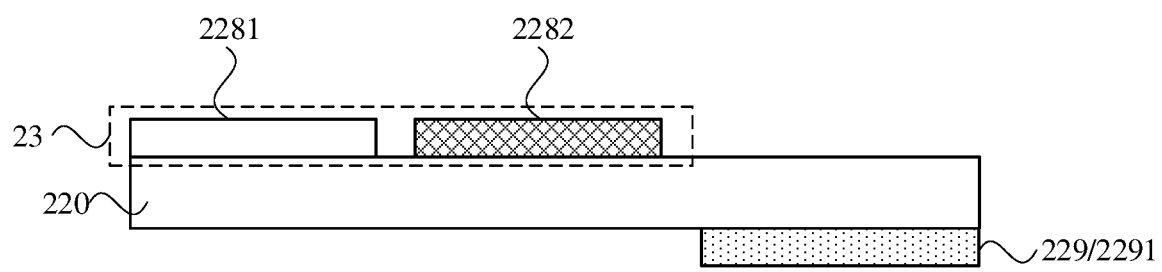
FIG. 33 is another cross-sectional view taken along line CC' of FIG. 30.
Figure 34:
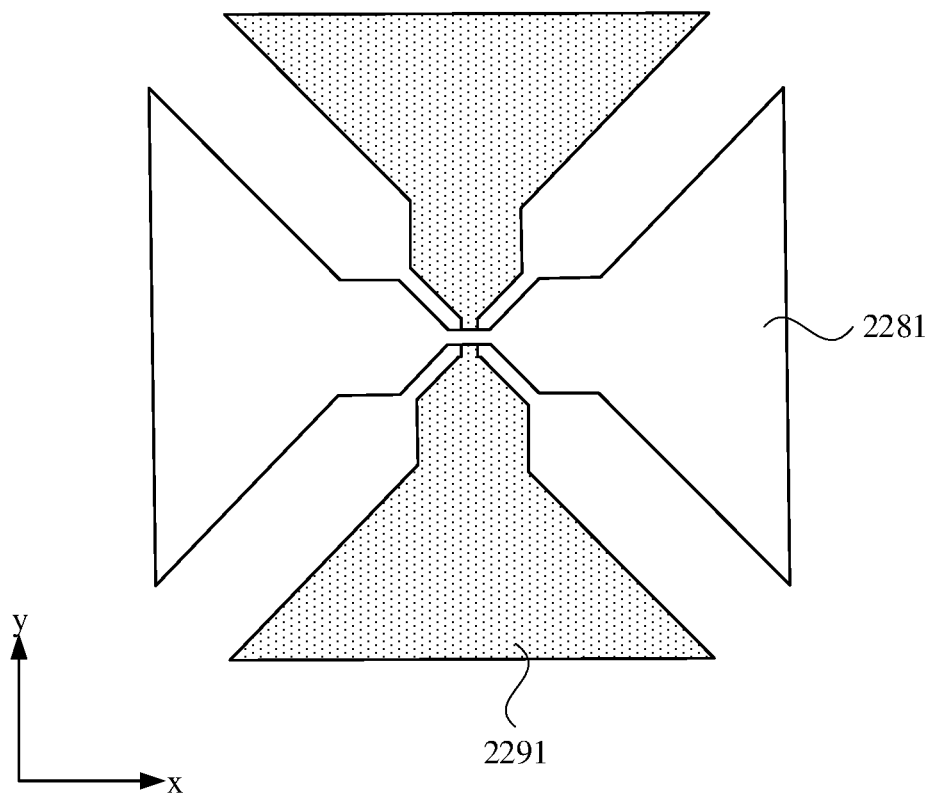
FIG. 34 is another enlarged view of the region S2 of FIG. 29.

Optionally, referring to FIGS. 31 and 32, the conductive layer further includes a substrate 60. In other embodiments, the second insulating layer may be used as a substrate. FIG. 33 is another cross-sectional view taken along line CC' of FIG. 30. Referring to FIG. 33, the second insulating layer 220 is used as a substrate, and the third touch electrode 2281 and the fourth touch electrode 2291 are located on opposite sides of the second insulating layer 220, respectively. In other embodiments, the touch pad may not be provided with dummy electrodes. Exemplarily, FIG. 34 is another enlarged view of the region S2 of FIG. 29. It is to be noted that shapes of the touch electrode and the dummy electrode in the figure are merely exemplary, may also be a diamond or other shapes designed according to design requirements, and are not limited herein.

Optionally, the conductive layer includes at least one transparent conductive layer electrically connected to a ground terminal of the driving substrate.

It is to be understood that the first antireflection structure provided in the embodiment of the present disclosure may also be used as a functional layer for dissipating static electricity in addition to being used as a touch pad. In this case, the conductive layer is set as an entire conductive layer and electrically connected to the ground terminal of the driving substrate.

In the display device provided in the embodiment of the present disclosure, the first antireflection structure and the second antireflection structure are designed as a whole, and the reflectivity, transmittance and hue characteristics of the whole are considered to satisfy the actual design requirements. Exemplarily, by way of example, the first antireflection structure is taken as a touch pad and the second antireflection structure is taken as a cover plate. In an embodiment, (1) the required reflectivity for a single touch pad is less than or equal to 0.2%, the hue coordinates satisfy that $-6 \leq a^* \leq 0$ and $-6 \leq b^* \leq 0$, and the hue is approximately blue or gray; (2) the required reflectivity for a single cover plate is less than or equal to 0.2%, the hue coordinates satisfy that $-6 \leq a^* \leq 0$ and $-6 \leq b^* \leq 0$, and the hue is approximately blue or gray; (3) the required reflectivity for the whole is less than or equal to 0.3%, the hue coordinates satisfy that $-6 \leq a^* \leq 0$ and $-6 \leq b^* \leq 0$, and the hue is approximately blue or gray. Through computer simulation, if the single touch pad satisfying the above condition (1) and the single cover plate satisfying the above condition (2) are designed individually, the overall reflectivity after simple bonding is greater than 0.5%, the hue coordinates a* and b* are both greater than 0, and the hue is approximately yellow, failing to satisfy the design requirements, i.e., the single cover plate and the single touch pad respectively satisfy the optical requirements, but the whole after bonding does not satisfy the requirements.

Figure 35:
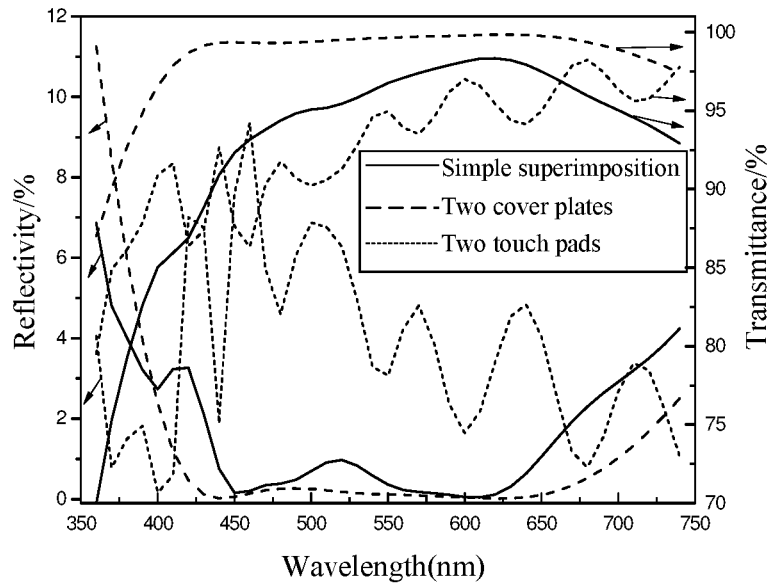
FIG. 35 is a schematic diagram illustrating a comparison of simulation results of multiple design schemes according to an embodiment of the present disclosure.

FIG. 35 is a schematic diagram illustrating a comparison of simulation results of multiple design schemes according to an embodiment of the present disclosure. As can be seen from a comparison of FIGS. 5, 14 and 35, the first antireflection structure and the second antireflection structure designed as a whole in the embodiment have lower reflectivity, higher transmittance and thinner overall thickness than the whole after simple bonding. For example, for light with a wavelength of 550 nm, the corresponding reflectivity is 0.155% and transmittance is 99.07% in FIG. 5, and the corresponding reflectivity is 0.142% and transmittance is 99.17% in FIG. 14. In a case where the first antireflection structure (single cover plate) and the second antireflection structure (single touch pad) are simply superimposed, the transmittance is apparently reduced, and as shown in FIG. 35, the reflectivity and transmittance of the two structures after bonding are 0.361% and 96.75% respectively. When two cycles of single cover plates are superimposed, the optical performance can still satisfy the requirements, but compared with a single cycle, the thickness is thicker, the number of film layers is doubled, being not friendly to the actual process, and the hue may not satisfy the requirements. If two cycles of single touch pads are superimposed, the optical performance (simulated this time) does not meet the standard. Even if other structures are used to make the optical performance meet the standard, the corresponding film thickness and number of film layers will be greatly increased, being not beneficial to actual production. Therefore, during design, the first antireflection structure and the second antireflection structure are considered as a whole, and the refractive index and thickness change relationships of respective film layers are comprehensively adjusted, so that an optical structure with both reflectivity and hue satisfying the requirements can be obtained.

Figure 36:
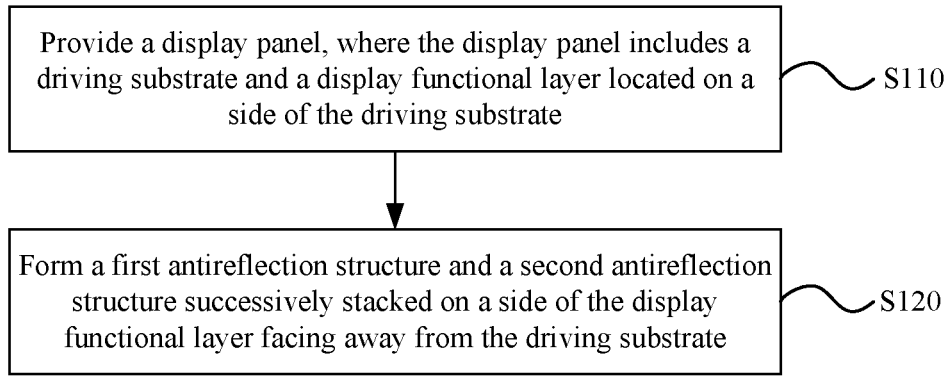
FIG. 36 is a flowchart illustrating a preparation method of a display device according to an embodiment of the present disclosure.

FIG. 36 is a flowchart illustrating a preparation method of a display device according to an embodiment of the present disclosure. The preparation method provided in the embodiment is used for preparing the display device in the above embodiment and includes steps described below.

In step S110, a display panel is provided, where the display panel includes a driving substrate and a display functional layer located on a side of the driving substrate.

The display panel may be a liquid crystal display panel, and the display functional layer includes liquid crystal at this time. The display panel may be an organic light emitting display panel, and the display functional layer includes an organic light emitting diode (OLED). The display panel may be a light emitting diode (LED) display panel, and the display functional layer includes an LED chip. The display panel may be a quantum dot display panel, and the display functional layer includes a quantum electric layer. The display panel may also be an electrophoretic display panel, and the display functional layer includes an electrophoretic film and the like. Selection can be made according to actual conditions during specific implementation.

In step S120, a first antireflection structure and a second antireflection structure successively stacked are formed on the side of the display functional layer facing away from the driving substrate.

The first antireflection structure includes a first graded-index layer, a conductive layer and a second graded-index layer which are successively stacked. The first graded-index layer includes at least two first sublayers, and the second graded-index layer includes at least two second sublayers. In the direction in which the first graded-index layer points to the conductive layer, refractive indexes of the first sublayers in the first graded-index layer successively increase, and refractive indexes of the second sublayers in the second graded-index layer successively decrease. The refractive index of the first sublayer adjacent to the conductive layer is less than or equal to the refractive index of the conductive layer, and the refractive index of the second sublayer adjacent to the conductive layer is less than or equal to the refractive index of the conductive layer. The second antireflection structure includes a third graded-index layer, a first dielectric layer and a fourth graded-index graded layer which are successively stacked. The third graded-index layer includes at least one third sublayer, and the fourth graded-index layer includes at least two fourth sublayers. In the direction in which the third graded-index layer points to the first dielectric layer, refractive indexes of the fourth sublayers in the fourth graded-index layer successively decrease. The refractive index of the third sublayer adjacent to the first dielectric layer is less than or equal to the refractive index of the first dielectric layer, and the refractive index of the third sublayer closest to the first antireflection structure is greater than or equal to the refractive index of the film layer adjacent to the third sublayer and close to the first antireflection structure. The refractive index of the fourth sublayer adjacent to the first dielectric layer is less than or equal to the refractive index of the first dielectric layer. The first antireflection structure may be a touch structure and may also be an antistatic structure. The second antireflection structure may be a cover plate structure of a display panel. The graded-index layer may be formed of materials such as silicon oxynitride, and the refractive index gradient is achieved through adjustment of the mass proportions of nitrogen and oxygen.

According to the technical solution in the embodiment of the present disclosure, the refractive index of the conductive layer is set to be greater than or equal to the refractive indexes of the first graded-index layer and second graded-index layer, and the refractive index of the first dielectric layer is set to be greater than or equal to the refractive indexes of the third graded-index layer and the fourth graded-index layer, thus forming a film structure having changing refractive indexes. The first graded-index layer, the second graded-index layer and the fourth graded-index layer are each set to include at least two sublayers to weaken the dielectric interface, and achieve the purpose of reducing reflected light and improving transmitted light by combining the principles of film interference and refractive index gradient. In the preparation process, each graded-index layer is a whole layer of material and can be formed by one process, thus being beneficial to reducing process difficulty and preparation cost. Hue adjustment is achieved according to combined adjustment of the relationships between refractive indexes and between thicknesses of various sublayers. Thus, the requirements of hue and low reflectivity are simultaneously satisfied by the antireflection structures.

Optionally, the display device further includes a first substrate, the first substrate being a second sublayer far from the display functional layer, and the manner of forming the first antireflection structure and the second antireflection structure successively stacked on the side of the display functional layer facing away from the driving substrate includes steps described below.

The first substrate is provided.

The first antireflection structure is formed on a side of the first substrate.

The second antireflection structure is formed on the side of the first substrate facing away from the first antireflection structure.

The first antireflection structure and the second antireflection structure are disposed on the side of the display functional layer facing away from the driving substrate.

The first substrate may be a glass substrate. In specific implementation, the refractive index of the first substrate is less than the refractive indexes of the adjacent second sublayer and the adjacent third sublayer, and the first substrate may be used as one sublayer of the second graded-index layer. In the embodiment, forming the first antireflection structure is forming other film layers except the first substrate in the first antireflection structure.

In specific implementation, the first substrate may also be used as a second substrate of the display panel. When the display device is a liquid crystal display device, a color resist layer needs to be disposed on the light emitting side of the display panel, and optionally, after the first antireflection structure is formed on the side of the first substrate, the method further includes a step described below.

A color resist layer is formed on the side of the first antireflection structure facing away from the first substrate.

In the previous embodiment, the first antireflection structure and the second antireflection structure are respectively located on two sides of the first substrate; in the preparation process, one antireflection structure is generally formed on one side and then the other antireflection structure is formed on the other side. In this way, defects such as scratches and the like may be caused to the previously formed structure during the preparation process, and therefore, in another embodiment, two antireflection structures can be disposed on the same side of the first substrate. Optionally, the display device further includes a first substrate, the first substrate being a first sublayer closest to the display functional layer, and the manner of forming the first antireflection structure and the second antireflection structure successively stacked on the side of the display functional layer facing away from the driving substrate includes steps described below.

The first substrate is provided.

The first antireflection structure is formed on a side of the first substrate.

The second antireflection structure is formed on the side of the first antireflection structure facing away from the first substrate.

The first antireflection structure and the second antireflection structure are disposed on the side of the display functional layer facing away from the driving substrate.

The first substrate may be a glass substrate. In specific implementation, the refractive index of the first substrate is less than the refractive index of the adjacent first sublayer, and the first substrate may be used as one sublayer of the first graded-index layer. In the embodiment, forming the first antireflection structure is forming other film layers except the first substrate in the first antireflection structure.

In another embodiment, the first substrate may also be located uppermost of the second antireflection structure. Optionally, the display device further includes a first substrate, the first substrate being a fourth sublayer farthest from the display functional layer, and the manner of forming the first antireflection structure and the second antireflection structure successively stacked on the side of the display functional layer facing away from the driving substrate includes steps described below.

The first substrate is provided.

The second antireflection structure is formed on a side of the first substrate.

The first antireflection structure is formed on the side of the second antireflection structure facing away from the first substrate.

The first antireflection structure and the second antireflection structure are disposed on the side of the display functional layer facing away from the driving substrate.

It is to be understood that steps for forming the insulating layer, the planarization layer, the polarizer and the like also exist in the specific implementation. Preparation can be made according to the existing manufacturing process, and is not limited in the embodiments of the present disclosure.

It is to be noted that the above are merely preferred embodiments of the present disclosure and the technical principles used therein. It is to be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above embodiments, the present disclosure is not limited to the above embodiments and may further include more other equivalent embodiments without departing from the concept of the present disclosure. The scope of the present disclosure is determined by the scope of the appended claims.

What is claimed is:

1. A display device, comprising:
a display panel, wherein the display panel comprises a driving substrate and a display functional layer located on a side of the driving substrate; and
a first antireflection structure and a second antireflection structure successively stacked on a side of the display functional layer facing away from the driving substrate;
wherein the first antireflection structure comprises a first graded-index layer, a conductive layer and a second graded-index layer which are successively stacked; the first graded-index layer comprises at least two first sublayers, and the second graded-index layer comprises at least two second sublayers; in a direction in which the first graded-index layer points to the conductive layer, refractive indexes of the at least two first sublayers in the first graded-index layer successively increase, and refractive indexes of the at least two second sublayers in the second graded-index layer successively decrease; a refractive index of a first sublayer adjacent to the conductive layer is less than or equal to a refractive index of the conductive layer; and a refractive index of a second sublayer adjacent to the conductive layer is less than or equal to the refractive index of the conductive layer; and the second antireflection structure comprises a third graded-index layer, a first dielectric layer and a fourth graded-index graded layer which are successively stacked; the third graded-index layer comprises at least one third sublayer, and the fourth graded-index layer comprises at least two fourth sublayers; in a direction in which the third graded-index layer points to the first dielectric layer, refractive indexes of the at least two fourth sublayers in the fourth graded-index layer successively decrease; a refractive index of a third sublayer adjacent to the first dielectric layer is less than or equal to a refractive index of the first dielectric layer, and a refractive index of a third sublayer close to the display functional layer is greater than or equal to a refractive index of a second sublayer far from the display functional layer; and a refractive index of a fourth sublayer adjacent to the first dielectric layer is less than or equal to the refractive index of the first dielectric layer.

2. The display device of claim 1, further comprising a first substrate, wherein the first substrate is the second sublayer far from the display functional layer.

3. The display device of claim 2, wherein the display panel further comprises a second substrate located on the side of the display functional layer facing away from the driving substrate; and
the first antireflection structure is attached, through optical adhesive, to a side of the second substrate facing away from the display functional layer.

4. The display device of claim 2, wherein the display panel further comprises a second substrate located on the side of the display functional layer facing away from the driving substrate; and
the second substrate is used as the first substrate.

5. The display device of claim 4, further comprising: a polarizer;
wherein the polarizer is disposed on a side of the fourth graded-index layer facing away from the first dielectric layer, or between the third graded-index layer and the first substrate, or between the second graded-index layer and the first substrate, or on a side of the first graded-index layer facing away from the conductive layer.

6. The display device of claim 4, further comprising: a color resist layer, wherein the color resist layer is located between the first graded-index layer and the display functional layer.

7. The display device of claim 1, further comprising a first substrate, wherein the first substrate is a first sublayer close to the display functional layer.

8. The display device of claim 7, wherein the display panel further comprises a second substrate located on the side of the display functional layer facing away from the driving substrate; and
the first substrate is attached, through optical adhesive, to a side of the second substrate facing away from the display functional layer.

9. The display device of claim 7, wherein the display panel further comprises a second substrate located on the side of the display functional layer facing away from the driving substrate; and
the second substrate is used as the first substrate.

10. The display device of claim 9, further comprising: a polarizer;
wherein the polarizer is disposed on a side of the fourth graded-index layer facing away from the first dielectric layer, or between the third graded-index layer and the second graded-index layer, or between the first graded-index layer and the first substrate, or on a side of the first substrate facing away from the first graded-index layer.

11. The display device of claim 1, further comprising a first substrate, wherein the first substrate is a fourth sublayer farthest from the display functional layer.

12. The display device of claim 1, wherein the first graded-index layer, the second graded-index layer, the third graded-index layer and the fourth graded-index layer each comprise nitrogen oxide; and
in the direction in which the first graded-index layer points to the conductive layer, a mass proportion of nitrogen in the first graded-index layer gradually increases, a mass proportion of oxygen in the first graded-index layer gradually decrease, a mass proportion of nitrogen in the second graded-index layer gradually decreases, a mass proportion of oxygen in the second graded-index layer gradually increases, a mass proportion of nitrogen in the third graded-index layer gradually increases, a mass proportion of oxygen in the third graded-index layer gradually decreases, a mass proportion of nitrogen in the fourth graded-index layer gradually decreases, and a mass proportion of oxygen in the fourth graded-index layer gradually increases.

13. The display device of claim 1, wherein a number of first sublayers is the same as a number of second sublayers, and refractive indexes of one of the first sublayers and one of the second sublayers that are symmetrical about the conductive layer are the same; and
a number of third sublayers is the same as a number of fourth sublayers, and refractive indexes of one of the third sublayers and one of the fourth sublayers that are symmetrical about the first dielectric layer are the same.

14. The display device of claim 1, wherein the conductive layer comprises at least one transparent conductive layer, and forms a touch electrode layer.

15. The display device of claim 1, wherein the second antireflection structure further comprises a second dielectric layer disposed on the side of the fourth graded-index layer facing away from the first dielectric layer, and a refractive index of the second dielectric layer is less than or equal to a refractive index of a fourth sublayer adjacent to the second dielectric layer.

16. A preparation method of a display device, comprising:
providing a display panel, wherein the display panel comprises a driving substrate and a display functional layer located on a side of the driving substrate; and
forming a first antireflection structure and a second antireflection structure successively stacked on a side of the display functional layer facing away from the driving substrate;
wherein the first antireflection structure comprises a first graded-index layer, a conductive layer and a second graded-index layer which are successively stacked; the first graded-index layer comprises at least two first sublayers, and the second graded-index layer comprises at least two second sublayers; in a direction in which the first graded-index layer points to the conductive layer, refractive indexes of the at least two first sublayers in the first graded-index layer successively increase, and refractive indexes of the at least two second sublayers in the second graded-index layer successively decrease; a refractive index of a first sublayer adjacent to the conductive layer is less than or equal to a refractive index of the conductive layer; and a refractive index of a second sublayer adjacent to the conductive layer is less than or equal to the refractive index of the conductive layer; and the second antireflection structure comprises a third graded-index layer, a first dielectric layer and a fourth graded-index graded layer which are successively stacked; the third graded-index layer comprises at least one third sublayer, and the fourth graded-index layer comprises at least two fourth sublayers; in a direction in which the third graded-index layer points to the first dielectric layer, refractive indexes of the at least two fourth sublayers in the fourth graded-index layer successively decrease; a refractive index of a third sublayer adjacent to the first dielectric layer is less than or equal to a refractive index of the first dielectric layer, and a refractive index of a third sublayer closest to the first antireflection structure is greater than or equal to a refractive index of a film layer adjacent to the third sublayer and close to the first antireflection structure; and a refractive index of a fourth sublayer adjacent to the first dielectric layer is less than or equal to the refractive index of the first dielectric layer.

17. The preparation method of claim 16, wherein the display device further comprises a first substrate and the first substrate is a second sublayer far from the display functional layer, and wherein forming the first antireflection structure and the second antireflection structure successively stacked on the side of the display functional layer facing away from the driving substrate comprises:
    providing the first substrate;
    forming the first antireflection structure on a side of the first substrate;
    forming the second antireflection structure on a side of the first substrate facing away from the first antireflection structure; and
    disposing the first antireflection structure and the second antireflection structure on the side of the display functional layer facing away from the driving substrate.

18. The preparation method of claim 17, after forming the first antireflection structure on the side of the first substrate, further comprising:
    forming a color resist layer on a side of the first antireflection structure facing away from the first substrate.

19. The preparation method of claim 16, wherein the display device further comprises a first substrate and the first substrate is a first sublayer closest to the display functional layer, and wherein forming the first antireflection structure and the second antireflection structure successively stacked on the side of the display functional layer facing away from the driving substrate comprises:
    providing the first substrate;
    forming the first antireflection structure on a side of the first substrate;
    forming the second antireflection structure on a side of the first antireflection structure facing away from the first substrate; and
    disposing the first antireflection structure and the second antireflection structure on the side of the display functional layer facing away from the driving substrate.

20. The preparation method of claim 16, wherein the display device further comprises a first substrate and the first substrate is a fourth sublayer farthest from the display functional layer, and wherein forming the first antireflection structure and the second antireflection structure successively stacked on the side of the display functional layer facing away from the driving substrate comprises:
    providing the first substrate;
    forming the second antireflection structure on a side of the first substrate;
    forming the first antireflection structure on a side of the second antireflection structure facing away from the first substrate; and
    disposing the first antireflection structure and the second antireflection structure on the side of the display functional layer facing away from the driving substrate.

* * * * *